US010209830B2

(12) United States Patent
Pedder et al.

(10) Patent No.: US 10,209,830 B2
(45) Date of Patent: Feb. 19, 2019

(54) ELECTRONIC DEVICE HAVING DIRECTION-DEPENDENT STRAIN ELEMENTS

(71) Applicant: Apple Inc., Cupertino, CA (US)

(72) Inventors: James E. Pedder, Cupertino, CA (US); John Stephen Smith, Cupertino, CA (US); Michael Vosgueritchian, Cupertino, CA (US); Vikram Garg, Cupertino, CA (US); Sinan Filiz, Cupertino, CA (US); Miguel C. Christophy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 193 days.

(21) Appl. No.: 15/273,577

(22) Filed: Sep. 22, 2016

(65) Prior Publication Data

US 2017/0285864 A1    Oct. 5, 2017

Related U.S. Application Data

(60) Provisional application No. 62/315,921, filed on Mar. 31, 2016.

(51) Int. Cl.
*G06F 3/045* (2006.01)
*G06F 3/044* (2006.01)
(Continued)

(52) U.S. Cl.
CPC .............. *G06F 3/0418* (2013.01); *G01L 1/18* (2013.01); *G01L 5/00* (2013.01); *G06F 3/044* (2013.01);
(Continued)

(58) Field of Classification Search
CPC ...... G06F 3/0418; G06F 3/0412; G06F 3/045; G06F 3/044; G06F 3/0414;
(Continued)

(56) References Cited

U.S. PATENT DOCUMENTS 3,745,502 A * 7/1973 Watanabe ............. G01L 1/2287
338/3
3,876,912 A    4/1975 Sanders
(Continued)

FOREIGN PATENT DOCUMENTS

CN    1527933 A    9/2004
CN    1796955       7/2006
(Continued)

OTHER PUBLICATIONS

International Search Report and Written Opinion dated May 24, 2017, PCT/US2017/020464, 18 pages.
(Continued)

*Primary Examiner* — Jonathan M Dunlap
(74) *Attorney, Agent, or Firm* — Brownstein Hyatt Farber Schreck, LLP

(57) ABSTRACT

A force sensor is disclosed. The force sensor includes a force-sensitive structure that compensates for temperature and other environmental changes through the use of a strain-sensitive element and one or more reference elements. An array of such force-sensitive structures forms a force-sensing layer.

20 Claims, 18 Drawing Sheets

(51) Int. Cl.
*G06F 3/041* (2006.01)
*G01L 5/00* (2006.01)
*G01L 1/18* (2006.01)
*H01L 27/32* (2006.01)

(52) U.S. Cl.
CPC ............ *G06F 3/045* (2013.01); *G06F 3/0412* (2013.01); *G06F 3/0414* (2013.01); *H01L 27/323* (2013.01); *G06F 2203/04103* (2013.01); *G06F 2203/04105* (2013.01)

(58) Field of Classification Search
CPC . G06F 2203/04105; G06F 2203/04103; G01L 5/00; G01L 1/18; H01L 27/323
USPC ............... 345/173–174; 73/862.041–862.046
See application file for complete search history.

(56) References Cited

U.S. PATENT DOCUMENTS

| | | | |
|---|---|---|---|
| 4,345,477 A | 8/1982 | Johnson | |
| 4,423,640 A | 1/1984 | Jetter | |
| 4,516,112 A | 5/1985 | Chen | |
| 4,634,917 A | 1/1987 | Dvorsky et al. | |
| 4,695,963 A | 9/1987 | Sagisawa | |
| 4,951,510 A | 8/1990 | Holm-Kennedy et al. | |
| 5,481,905 A | 1/1996 | Pratt | |
| 5,577,021 A | 11/1996 | Nakatani et al. | |
| 5,616,846 A | 4/1997 | Kwasnik | |
| 5,673,041 A | 9/1997 | Chatigny et al. | |
| 5,708,460 A | 1/1998 | Young | |
| 5,790,215 A | 8/1998 | Sugahara | |
| 5,844,506 A | 12/1998 | Binstead | |
| 5,915,285 A | 6/1999 | Sommer | |
| 6,288,829 B1 | 9/2001 | Kimura | |
| 6,369,865 B2 | 4/2002 | Hinata | |
| 6,386,023 B1 | 4/2002 | Sajna et al. | |
| 6,637,276 B2 | 10/2003 | Adderton et al. | |
| 6,812,161 B2 | 11/2004 | Heremans | |
| 6,973,837 B2* | 12/2005 | Barnett .................. | G01D 3/022 73/765 |
| 7,154,481 B2 | 12/2006 | Cross et al. | |
| 7,176,897 B2 | 2/2007 | Roberts | |
| 7,190,350 B2 | 3/2007 | Roberts | |
| 7,196,694 B2 | 3/2007 | Roberts | |
| 7,211,885 B2 | 5/2007 | Nordal et al. | |
| 7,320,253 B2 | 1/2008 | Hanazawa et al. | |
| 7,331,245 B2 | 2/2008 | Nishimura | |
| 7,392,716 B2 | 7/2008 | Wilner | |
| 7,441,467 B2 | 10/2008 | Bloom | |
| 7,456,823 B2 | 11/2008 | Poupyrev et al. | |
| 7,511,702 B2 | 3/2009 | Hotelling | |
| 7,538,760 B2 | 5/2009 | Hotelling et al. | |
| 7,707,894 B2* | 5/2010 | Sumigawa ............... | G01B 7/16 73/727 |
| 7,724,248 B2 | 5/2010 | Saito | |
| 7,755,616 B2 | 7/2010 | Jung et al. | |
| 7,800,592 B2 | 9/2010 | Kerr et al. | |
| 7,903,091 B2 | 3/2011 | Lee | |
| 7,992,448 B2* | 8/2011 | Shimazu .................. | G01B 7/18 73/775 |
| 8,020,456 B2 | 9/2011 | Liu et al. | |
| 8,050,876 B2 | 11/2011 | Feen et al. | |
| 8,056,421 B2* | 11/2011 | Sumigawa ............... | G01B 7/16 73/727 |
| 8,077,154 B2 | 12/2011 | Emig et al. | |
| 8,132,468 B2 | 3/2012 | Radivojevic | |
| 8,243,225 B2 | 8/2012 | Kai et al. | |
| 8,266,971 B1 | 9/2012 | Jones | |
| 8,305,358 B2 | 11/2012 | Klighult et al. | |
| 8,411,064 B2 | 4/2013 | Noguchi et al. | |
| 8,421,483 B2 | 4/2013 | Klinghult et al. | |
| 8,434,369 B2 | 5/2013 | Hou et al. | |
| 8,456,430 B2 | 6/2013 | Oliver et al. | |
| 8,482,545 B2 | 7/2013 | King-Smith et al. | |
| 8,519,974 B2 | 8/2013 | Berggren | |
| 8,531,429 B2 | 9/2013 | Chang | |
| 8,605,053 B2 | 12/2013 | Murphy et al. | |
| 8,648,816 B2 | 2/2014 | Homma et al. | |
| 8,669,952 B2 | 3/2014 | Hashimura et al. | |
| 8,669,962 B2 | 3/2014 | Kuan | |
| 8,681,122 B2 | 3/2014 | Pirogov et al. | |
| 8,692,646 B2 | 4/2014 | Lee et al. | |
| 8,695,433 B2* | 4/2014 | Shimazu .................. | G01B 7/18 73/727 |
| 8,711,128 B2 | 4/2014 | Small et al. | |
| 8,780,060 B2 | 7/2014 | Maschmeyer et al. | |
| 8,780,074 B2 | 7/2014 | Castillo et al. | |
| 8,780,543 B2 | 7/2014 | Molne et al. | |
| 8,870,087 B2 | 10/2014 | Coogan et al. | |
| 8,878,803 B2 | 11/2014 | Kimura et al. | |
| 8,982,088 B2 | 3/2015 | Kung | |
| 8,988,384 B2 | 3/2015 | Krah | |
| 9,007,333 B1 | 4/2015 | Wilson | |
| 9,057,653 B2 | 4/2015 | Schediwy | |
| 9,024,904 B2 | 5/2015 | Jung et al. | |
| 9,024,910 B2 | 5/2015 | Stephanou et al. | |
| 9,024,918 B2 | 5/2015 | Cok | |
| 9,030,427 B2 | 5/2015 | Yasumatsu | |
| 9,063,599 B2 | 6/2015 | Yanagi et al. | |
| 9,081,460 B2 | 7/2015 | Jeong et al. | |
| 9,099,971 B2 | 8/2015 | Lynn et al. | |
| 9,110,532 B2 | 8/2015 | Ando et al. | |
| 9,116,569 B2 | 8/2015 | Stacy et al. | |
| 9,116,570 B2 | 8/2015 | Lee et al. | |
| 9,128,547 B2 | 9/2015 | Kodani et al. | |
| 9,134,826 B2 | 9/2015 | Andoh | |
| 9,158,407 B2 | 10/2015 | Coulson | |
| 9,182,849 B2 | 11/2015 | Huang et al. | |
| 9,182,859 B2 | 11/2015 | Coulson et al. | |
| 9,200,970 B2 | 12/2015 | Kodani et al. | |
| 9,223,162 B2 | 12/2015 | DeForest et al. | |
| 9,223,445 B2 | 12/2015 | Sleeman et al. | |
| 9,246,486 B2 | 1/2016 | Yang et al. | |
| 9,262,002 B2 | 2/2016 | Momeyer et al. | |
| 9,262,003 B2 | 2/2016 | Kitchens | |
| 9,292,115 B2 | 3/2016 | Kauhanen | |
| 9,304,348 B2 | 4/2016 | Jang | |
| 9,329,719 B2 | 5/2016 | Molne et al. | |
| 9,360,977 B2 | 6/2016 | Aberg | |
| 9,367,173 B2 | 6/2016 | Setlak | |
| 9,383,848 B2 | 7/2016 | Daghigh | |
| 9,417,696 B2 | 8/2016 | DeLuca | |
| 9,417,725 B1 | 8/2016 | Watazu et al. | |
| 9,454,268 B2 | 9/2016 | Badaye et al. | |
| 9,459,734 B2 | 10/2016 | Day | |
| 9,466,783 B2 | 10/2016 | Olien et al. | |
| 9,477,342 B2 | 10/2016 | Daverman et al. | |
| 9,501,167 B2 | 11/2016 | Day | |
| 9,507,456 B2 | 11/2016 | Watazu et al. | |
| 9,519,378 B2 | 12/2016 | Watazu et al. | |
| 9,542,028 B2 | 1/2017 | Filiz et al. | |
| 9,557,857 B2 | 1/2017 | Schediwy | |
| 9,562,814 B2 | 2/2017 | Kulkarni et al. | |
| 9,563,317 B2 | 2/2017 | Sleeman et al. | |
| 9,612,170 B2 | 4/2017 | Vosgueritchian et al. | |
| 9,639,224 B2 | 5/2017 | Lee | |
| 9,658,722 B2 | 5/2017 | Schwartz | |
| 9,665,200 B2 | 5/2017 | Filiz et al. | |
| 9,690,408 B1 | 6/2017 | Krah | |
| 9,690,413 B2 | 6/2017 | Filiz | |
| 9,690,414 B2 | 6/2017 | Kano et al. | |
| 9,729,730 B2 | 8/2017 | Levesque et al. | |
| 9,791,958 B2* | 10/2017 | Yang .................. | H03K 17/9625 |
| 9,841,850 B2 | 12/2017 | Schediwy et al. | |
| 9,864,450 B2 | 1/2018 | Watazu et al. | |
| 9,881,577 B2 | 1/2018 | Wang et al. | |
| 9,916,942 B2 | 3/2018 | Shedletsky | |
| 10,007,380 B2 | 6/2018 | Yoon et al. | |
| 10,032,592 B2 | 7/2018 | Brooks et al. | |
| 2002/0149571 A1 | 10/2002 | Roberts | |
| 2006/0043508 A1* | 3/2006 | Ohta ........................ | G01L 1/18 257/417 |
| 2007/0159561 A1 | 7/2007 | Chien | |

(56) References Cited

U.S. PATENT DOCUMENTS

| | | |
|---|---|---|
| 2008/0165159 A1 | 7/2008 | Soss et al. |
| 2008/0218488 A1 | 9/2008 | Yang et al. |
| 2009/0002199 A1 | 1/2009 | Lainonen et al. |
| 2009/0189866 A1 | 7/2009 | Haffenden et al. |
| 2009/0249885 A1* | 10/2009 | Shkel ............... G01B 7/22 |
| | | 73/780 |
| 2009/0267902 A1 | 10/2009 | Nambu et al. |
| 2009/0316380 A1 | 12/2009 | Armstrong |
| 2010/0103115 A1 | 4/2010 | Hainzl |
| 2010/0117809 A1 | 5/2010 | Dai et al. |
| 2010/0123686 A1* | 5/2010 | Klinghult ............ G06F 3/0412 |
| | | 345/178 |
| 2010/0128002 A1* | 5/2010 | Stacy ............... G06F 3/016 |
| | | 345/174 |
| 2010/0201635 A1* | 8/2010 | Klinghult ............ G06F 3/0414 |
| | | 345/173 |
| 2011/0045285 A1 | 2/2011 | Saiki et al. |
| 2011/0248839 A1 | 10/2011 | Kwok et al. |
| 2011/0261021 A1 | 10/2011 | Modarres et al. |
| 2011/0285660 A1 | 11/2011 | Prabhu et al. |
| 2012/0019448 A1 | 1/2012 | Pitkanen et al. |
| 2012/0038577 A1 | 2/2012 | Brown et al. |
| 2012/0105367 A1 | 5/2012 | Son et al. |
| 2012/0127136 A1 | 5/2012 | Schneider et al. |
| 2012/0154299 A1 | 6/2012 | Hsu et al. |
| 2012/0188198 A1 | 7/2012 | Jeong et al. |
| 2012/0247220 A1* | 10/2012 | Inamori ............... G01B 7/18 |
| | | 73/766 |
| 2012/0293491 A1 | 11/2012 | Wang et al. |
| 2013/0009905 A1* | 1/2013 | Castillo ............... G06F 3/044 |
| | | 345/174 |
| 2013/0074988 A1 | 3/2013 | Chou |
| 2013/0082970 A1 | 4/2013 | Frey et al. |
| 2013/0141365 A1 | 6/2013 | Lynn et al. |
| 2013/0147739 A1 | 6/2013 | Aberg et al. |
| 2013/0154933 A1 | 6/2013 | Sheik-Nainar |
| 2013/0154998 A1* | 6/2013 | Yang ............... H03K 17/9625 |
| | | 345/174 |
| 2013/0155059 A1 | 6/2013 | Wang et al. |
| 2013/0215056 A1 | 8/2013 | Johansson et al. |
| 2013/0222306 A1* | 8/2013 | Aberg ............... G06F 1/206 |
| | | 345/173 |
| 2013/0328803 A1 | 12/2013 | Fukushima et al. |
| 2013/0333922 A1 | 12/2013 | Kai et al. |
| 2014/0085253 A1 | 3/2014 | Leung et al. |
| 2014/0118635 A1 | 5/2014 | Yang |
| 2014/0191973 A1 | 7/2014 | Zellers et al. |
| 2014/0327847 A1 | 11/2014 | Park et al. |
| 2015/0002452 A1 | 1/2015 | Klinghult |
| 2015/0101849 A1 | 4/2015 | Bockmeyer et al. |
| 2015/0116260 A1 | 4/2015 | Hoen et al. |
| 2015/0242037 A1 | 8/2015 | Pedder et al. |
| 2015/0268725 A1 | 9/2015 | Levesque et al. |
| 2015/0301684 A1 | 10/2015 | Shimamura |
| 2015/0331517 A1 | 11/2015 | Filiz et al. |
| 2016/0003697 A1 | 1/2016 | Okamoto et al. |
| 2016/0033389 A1 | 2/2016 | Serpe |
| 2016/0034073 A1 | 2/2016 | Andoh |
| 2016/0035290 A1 | 2/2016 | Kim et al. |
| 2016/0041672 A1 | 2/2016 | Hoen et al. |
| 2016/0048266 A1 | 2/2016 | Smith et al. |
| 2016/0062517 A1 | 3/2016 | Meyer et al. |
| 2016/0077649 A1 | 3/2016 | Ando et al. |
| 2016/0117035 A1 | 4/2016 | Watazu et al. |
| 2016/0132151 A1 | 5/2016 | Watazu et al. |
| 2016/0147353 A1 | 5/2016 | Filiz et al. |
| 2016/0306481 A1 | 10/2016 | Filiz et al. |
| 2016/0357297 A1 | 12/2016 | Picciotto et al. |
| 2017/0031495 A1 | 2/2017 | Smith |
| 2017/0075465 A1 | 3/2017 | Pedder et al. |
| 2017/0090638 A1 | 3/2017 | Vosgueritchian et al. |
| 2017/0090655 A1 | 3/2017 | Zhang et al. |
| 2017/0191884 A1 | 7/2017 | Vosgueritchian et al. |
| 2017/0261387 A1 | 9/2017 | Vosgueritchian et al. |
| 2017/0269757 A1 | 9/2017 | Filiz et al. |
| 2017/0285799 A1 | 10/2017 | Iuchi et al. |
| 2018/0059839 A1* | 3/2018 | Kim ............... G06F 3/0412 |
| 2018/0067612 A1* | 3/2018 | Smith ............... G06F 3/0418 |
| 2018/0074638 A1* | 3/2018 | Chiang ............... G06F 3/0414 |
| 2018/0157363 A1 | 6/2018 | Vosgueritchian et al. |
| 2018/0217708 A1 | 8/2018 | Hoen et al. |

FOREIGN PATENT DOCUMENTS

| | | |
|---|---|---|
| CN | 1860432 | 11/2006 |
| CN | 101017419 | 8/2007 |
| CN | 101071354 | 11/2007 |
| CN | 101201277 A | 6/2008 |
| CN | 101243383 | 8/2008 |
| CN | 101950224 | 1/2011 |
| CN | 102012772 | 4/2011 |
| CN | 102047088 | 5/2011 |
| CN | 102117158 | 7/2011 |
| CN | 102165400 | 8/2011 |
| CN | 102175362 A | 9/2011 |
| CN | 102308269 | 1/2012 |
| CN | 102368191 | 3/2012 |
| CN | 102460351 | 5/2012 |
| CN | 102591519 | 7/2012 |
| CN | 102822779 | 12/2012 |
| CN | 103026327 | 4/2013 |
| CN | 103069365 | 4/2013 |
| CN | 103197821 | 7/2013 |
| CN | 103336562 | 10/2013 |
| CN | 103582807 | 2/2014 |
| CN | 103955321 | 7/2014 |
| CN | 204461655 U | 7/2015 |
| CN | 104866134 | 8/2015 |
| CN | 204576454 U | 8/2015 |
| CN | 105444662 | 3/2016 |
| CN | 205068342 | 3/2016 |
| CN | 105793803 | 7/2016 |
| EP | 0332365 | 9/1989 |
| EP | 0467562 | 1/1992 |
| EP | 1840714 | 10/2007 |
| EP | 2120136 | 11/2009 |
| EP | 2381340 | 10/2011 |
| EP | 2629075 | 8/2013 |
| FR | 2907563 | 4/2008 |
| JP | 2013503388 | 1/1900 |
| JP | H09511086 | 11/1997 |
| JP | 2008226641 | 9/2008 |
| JP | 201039458 A | 2/2010 |
| JP | 2010197066 | 9/2010 |
| JP | 2011258530 | 12/2011 |
| JP | 2012053646 | 3/2012 |
| JP | 2012517584 | 8/2012 |
| JP | 2014135010 | 7/2014 |
| WO | WO 96/038833 | 12/1996 |
| WO | WO 02/035461 | 5/2002 |
| WO | WO 07/074800 | 7/2007 |
| WO | WO 08/076393 | 6/2008 |
| WO | WO 11/156447 | 12/2011 |
| WO | WO 12/168892 | 12/2012 |
| WO | WO 13/177322 | 11/2013 |
| WO | WO 14/016429 | 1/2014 |
| WO | WO 15/106183 | 7/2015 |
| WO | WO 15/158952 | 10/2015 |
| WO | WO 16/029354 | 3/2016 |

OTHER PUBLICATIONS

Bau, et al., "TeslaTouch: Electrovibration for Touch Surfaces," UIST'10, Oct. 3-6, 2010, New York, New York USA, 10 pages.

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

Rausch, "Printed piezoresistive strain sensors for monitoring of light-weight structures," SENSOR+TEST Conferences 2011—SENSOR Proceedings, pp. 216-220.

(56) References Cited

OTHER PUBLICATIONS

Schweizer, "Electrical characterization and investigation of the piezoresistive effect of PEDOT:PSS thin films," A Thesis Presented to the Academic Faculty in Partial Fulfillment of the Requirements for the Degree Master of Science of Electrical and Computer Engineering, Georgia Institute of Technology, Apr. 2005, 89 pages.
Takamatsu, et al., "Transparent conductive-polymer strain sensors for touch input sheets of flexible displays," *Journal of Micromechanics and Microengineering*, vol. 20, 2010, 6 pages.
Tsai, et al., "Fabrication of Graphene-based Micro Strain Gauge," NPL Management Ltd.—Internal, Oct. 15-16, 2012, 1 page.

\* cited by examiner

ELECTRONIC DEVICE HAVING DIRECTION-DEPENDENT STRAIN ELEMENTS

CROSS-REFERENCE TO RELATED APPLICATION

This application is a nonprovisional patent application of U.S. Patent Application No. 62/315,921, filed Mar. 31, 2016 and titled "Electronic Device Having Direction-Dependent Strain Elements," the disclosure of which is hereby incorporated herein by reference in its entirety.

FIELD

The described embodiments relate generally to a force sensor for an electronic device and, more particularly, to force sensors that use direction-dependent strain elements to compensate for environmental conditions.

BACKGROUND

Electronic devices may include various forms of user-input devices. Traditionally, electronic devices use buttons, keys, or other types of electromechanical actuators to receive user input. Increasingly, electronic devices are using electronic touch-enabled sensors to receive user input directly from a user's finger or stylus. However, the performance of some touch-enabled sensors may be affected by temperature and other environmental factors, which tend to vary over time.

SUMMARY

Embodiments described herein generally relate to an electronic device including an array of force sensors which detect and measure an amount of force applied to a surface of the electronic device. In an example embodiment, an electronic device includes an enclosure housing a display, with a transparent cover over the display. The electronic device also includes an opaque force-sensing layer beneath the display. The force-sensing layer includes an array of force-sensitive structures disposed on a substrate A force-sensitive structure includes a strain-sensitive element, a first reference element positioned proximate to the strain-sensitive element, and a second reference element positioned proximate to the strain-sensitive element. When the transparent cover is deflected, each of the strain-sensitive element, the first reference element, and the second reference element produces an electrical response to the deflection. The magnitude of the electrical responses of the first reference element and the second reference element are less than the electrical response of the strain-sensitive element. The electronic device may also include force-sensing circuitry operatively coupled to the array of force-sensitive structures and configured to estimate a temperature-compensated strain using the electrical responses of the force-sensitive structure.

In some cases, the strain-sensitive element is formed from conductive material defining a first set of interconnected traces formed along a first direction. The first and second reference elements may be formed from the same conductive material defining a second and third set of interconnected traces formed along a second direction, the second direction being transverse to the first direction.

In some cases, the substrate includes a first substrate layer and a second substrate layer. A first strain-relief feature is formed into the first substrate layer between the strain-sensitive element and the first reference element. A second strain-relief feature is formed into the first substrate layer between the strain-sensitive element and the second reference element.

Some example embodiments are directed to a force-sensing layer for sensing a force applied to an electronic device. The force-sensing layer may include a substrate and an array of force-sensitive structures arranged on the substrate. Each of the force-sensitive structures may include a strain-sensitive element positioned on the substrate and a reference element positioned on the substrate proximate to the strain-sensitive element. The strain-sensitive element and the reference element are disposed in an interlocking spiral pattern. The strain-sensitive element and the reference element each produce a change in resistance in response to strain along a given direction, with the strain-sensitive element producing a larger change in resistance than the reference element.

Some example embodiments are directed to an electronic device having a component forming an exterior surface of the electronic device and a force-sensing layer structure positioned below the exterior surface. The force-sensing layer includes a substrate attached to the component and an array of force-sensitive structures disposed on the substrate. In response to a deflection in the exterior surface, the substrate produces strain along a series of radial paths extending between a middle region of the substrate and a perimeter of the substrate.

Each force-sensitive structure includes a first strain-sensitive element and a second strain-sensitive element positioned adjacent the first strain-sensitive element. The first strain-sensitive element exhibits a primary sensitivity to strain along a first direction substantially aligned with a respective radial path. The second strain-sensitive element exhibits a primary sensitivity to strain along a second direction that is transverse to the first direction. In response to the deflection in the exterior surface, the first strain-sensitive element exhibits a first change in resistance and the second strain-sensitive element exhibits a second change in resistance that is smaller than the first change in resistance.

Some example embodiments are directed to a device including an enclosure and a display positioned at least partially within the enclosure. A transparent cover may be positioned over the display and may define a perimeter surrounding a middle region. A force-sensing layer may be positioned beneath the transparent cover. The force-sensing layer may include a substrate and an array of force-sensitive structures on the substrate. Each force-sensitive structure may include a first strain-sensitive element having a first set of traces aligned along a first direction defined as extending between the perimeter and the middle region, and a second strain-sensitive element positioned proximate to the first strain-sensitive element and having a second set of traces aligned transverse to the first set of traces of the first strain-sensitive element. In some embodiments, the electronic device also includes force-sensing circuitry operatively coupled to the first and second strain-sensitive elements and configured to estimate a temperature-compensated strain based on a change in resistance of both the first and second strain-sensitive elements.

BRIEF DESCRIPTION OF THE DRAWINGS

The disclosure will be readily understood by the following detailed description in conjunction with the accompanying drawings, wherein like reference numerals designate like structural elements.

Figure 1:
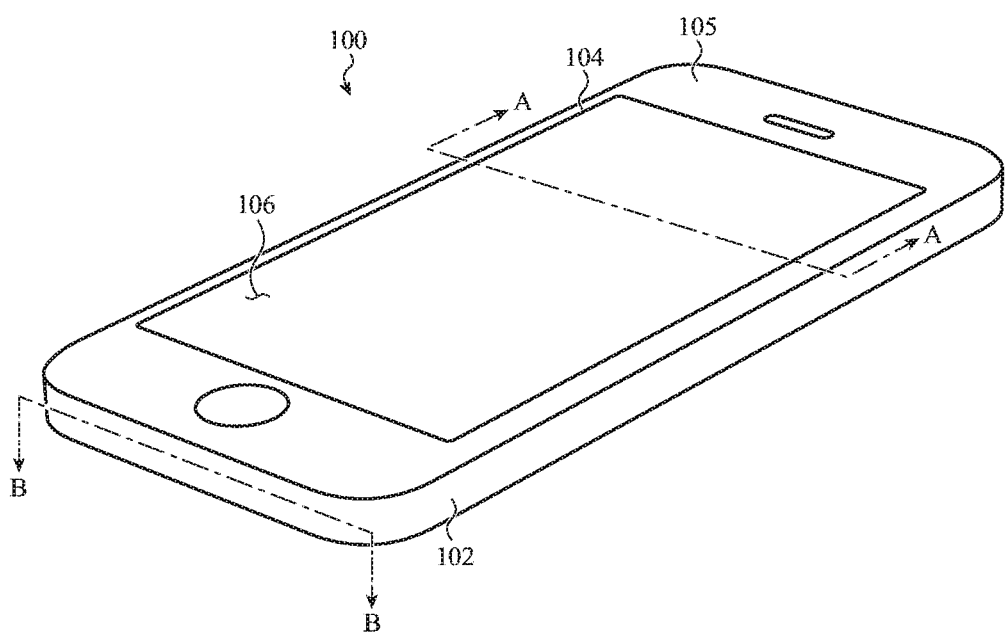
FIG. 1 depicts an electronic device with an input surface configured to receive force input from a user.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following descriptions are not intended to limit the embodiments to one preferred embodiment. To the contrary, they are intended to cover alternatives, modifications, and equivalents as can be included within the spirit and scope of the described embodiments as defined by the appended claims.

Embodiments described herein may relate to or take the form of an electronic device that incorporates a force sensor with a strain-sensitive element used to detect touch or force input on a surface of the electronic device. In particular, the force sensor may include an arrangement of strain-sensitive elements, each having a direction-dependent strain response. The output from two or more strain-sensitive elements may be used to reduce or eliminate adverse effects due to variations in environmental conditions. The output of the force sensor may be combined with the output of a touch sensor or other user-input device to control aspects of the electronic device.

Generally and broadly, a user touch event may be sensed on a cover sheet over a display, enclosure, or other surface associated with an electronic device using input sensors that include a touch sensor to detect the presence and location of the touch event and a force sensor adapted to determine the magnitude of force of the touch event. The force sensor may produce a non-binary output that corresponds to an amount of applied force. In particular, a force output generated using the force sensor may correspond to the magnitude of a force applied to the surface of the electronic device.

The determined magnitude of force may be used as an input signal, input data, or other input information to the electronic device. Because the output of the force sensor is non-binary or scaled, the force sensor may be used to control functions or operations that are responsive to a varying input. For example, the force sensor may be used to adjust the audio volume of a speaker, the brightness of a display, or the line weight of a stylus pen.

The force sensor may also be used to distinguish different user-input commands based on a force threshold value. In one example, a high force input event (having a magnitude greater than a force threshold) may be interpreted differently from a low force input event (having a magnitude less than a force threshold). For example, a smart phone may unlock a display screen with a high force input event and may pause audio output for a low force input event. The device's responses or outputs may thus differ in response to the two input events, even though they occur at the same point and may use the same input device. In further examples, a change in applied force may be interpreted as an additional type of input event. For example, a user may hold a wearable device force sensor proximate to an artery in order to evaluate blood pressure or heart rate. One may appreciate that a force sensor may be used for collecting a variety of user inputs.

The force sensor may be used to create or define a force-sensitive surface over a portion of the electronic device. In some embodiments, a force sensor includes a strain-sensitive element and is configured to measure a change in a strain-responsive electrical property of the strain-sensitive element. In some cases, the strain-sensitive element may exhibit a change in resistance in response to a change in strain. The change in resistance may be correlated to or used to estimate an applied force.

The performance of the force sensor is dependent, in part, on the precision, accuracy, and resolution with which the strain experienced by the strain-sensitive element may be estimated. As discussed above, the force sensor may be configured to measure a change in the resistance of the strain-sensitive element due to applied force. However, an actual measurement of the element resistance may also be sensitive to variations in temperature, both across the device and localized over a portion of a force-sensitive surface. In some cases, a strain-sensitive element may exhibit a change in resistance due to a combination of strain- and temperature-based effects. Variations in temperature may also cause thermal expansion or contraction within the electronic device, which may also adversely affect a force measurement. The embodiments described herein may be used to reduce or eliminate effects due to temperature or other environmental conditions.

In general, the force sensor may be transparent or optically opaque for integration within a laminated display stack of an electronic device. The electronic device may be, for example, a mobile phone, a tablet computing device, a computer display, a notebook computing device, a desktop computing device, a computing input device (such as a touch pad, keyboard, or mouse), a wearable device, a health monitor device, a sports accessory device, and so on.

In many cases, a force sensor is implemented on an opaque force-sensing layer below a transparent cover (e.g., cover sheet) of an electronic device. The force-sensing layer may include a substrate having an array of force-sensitive structures on one or more surfaces of the substrate. Each force-sensitive structure may in turn include multiple strain-sensitive elements which may include independent conductive traces having a direction-dependent strain response. In some cases, two or more strain-sensitive elements having traces arranged transverse to each other may be formed into sensing groups also referred to as force-sensitive structures. The output from the force-sensitive structures may be used to mitigate or eliminate variations in measurements as a result of changing environmental conditions, such as changes in temperature.

In one configuration, a force sensor includes a force-sensing layer that is integrated into one or more layers of a display stack (e.g., an optically opaque layer within or below a display stack). The force-sensing layer may include an array of force-sensitive structures that are configured to detect a localized deflection of the display stack. Each force-sensitive structure may include two or more strain-sensitive elements. In one configuration, a force-sensitive structure includes a strain-sensitive element (e.g., a first strain-sensitive element) and a pair of reference elements (e.g., a second and third strain-sensitive element) positioned proximate to the strain-sensitive element. The strain-sensitive element and reference elements may be formed from the same material but may have major or dominant traces that are arranged transverse (e.g., orthogonal) to one another. Because the elements are positioned proximate to each other, environmental conditions affect the strain-sensitive element and the reference elements in substantially the same manner. Thus, variations in electrical response from the strain-sensitive element that are due to environmental conditions can be canceled using the reference elements using, for example, a differential measurement technique.

The various strain-sensitive elements may be disposed on the same side of a single substrate, on opposing sides of the single substrate, or disposed on different substrates. Regardless of the configuration, it may be advantageous to arrange the strain-sensitive elements proximate to each other so that adverse effects due to localized variations in temperature may be reduced.

The shape or geometry of the strain-sensitive and/or reference elements may vary. In some embodiments, the strain-sensitive and/or reference elements may include a set of (primary) traces that all extend along a primary or dominant strain-sensing direction. For example, the strain-sensitive elements may be formed from a set of traces arranged in a forked or comb-shaped configuration. The traces may also have a serpentine shape having elongated portions forming the primary traces. A forked- or serpentine-shaped set of traces may increase the sensitivity of the force sensor by increasing an overall or effective length of the resistive structure that is subject to strain. Other shapes include, but are not limited to: linear serpentine shapes, radial serpentine shapes, spiral shapes, doubled-back spiral shapes, and so on.

Each force-sensitive structure may be configured to maximize a strain response along a particular direction. For example, the length and/or direction of the traces of one or more of the strain-sensitive elements may be oriented along a primary direction. The force-sensitive structure may also include or be formed in conjunction with stress-relieving or stress-concentrating features that help isolate or concentrate the strain along a particular direction.

In some embodiments, the primary direction for each force-sensitive structure varies with respect to its location within the array. The force-sensitive structures may be configured to sense the natural deflected shape of the display stack given a set of boundary conditions. For example, a transparent cover of the electronic device may define a perimeter region surrounding a middle region. Each of the force-sensitive structures may be oriented such that a primary direction is defined as extending between the perimeter region and the middle region of the transparent cover.

These and other embodiments are discussed below with reference to FIGS. 1-15. However, those skilled in the art will readily appreciate that the detailed description given herein with respect to these Figures is for explanatory purposes only and should not be construed as limiting.

FIG. 1 illustrates an electronic device 100 that can include a force-sensing layer with one or more force-sensitive structures, as described herein. In particular, the force-sensitive structures of the force-sensing layer may be configured to reduce or eliminate variations in a force measurement due to variations in temperature or other environmental conditions. The force-sensing layer may be integrated or incorporated with a display 104 and/or an enclosure 102 of the electronic device 100. Example force-sensing layers and force-sensing configurations are described in more detail below with respect to FIGS. 2-15.

As shown in FIG. 1, the electronic device 100 includes an enclosure 102 to retain, support, and/or enclose various components of the electronic device 100, such as a display 104. The display 104 can provide a visual output to the user. The display 104 can be implemented with any suitable technology, including, but not limited to: a liquid-crystal display (LCD) element, an organic light emitting diode (OLED) element, an electroluminescent display (ELD), and the like.

A cover sheet 105 may be positioned over the front surface (or a portion of the front surface) of the electronic device 100. At least a portion of the cover sheet 105 can function as an input surface 106 that receives touch and/or force inputs. The cover sheet 105 can be formed with any suitable material, such as glass, plastic, sapphire, or combinations thereof. In one embodiment, the cover sheet 105 covers the display 104. Touch and force inputs can be received by the portion of the cover sheet 105 that covers the display 104. In some embodiments, an input surface 106 may be defined over a non-display portion of the electronic device 100, for example, over a region of the exterior of the enclosure 102.

The electronic device may also include a touch sensor that is configured to determine a location of a finger or touch over the input surface 106 of the device 1100. The touch sensor may be implemented in a touch sensor layer, and may include a capacitive array of electrodes or nodes that operate in accordance with a mutual-capacitance or self-capacitance scheme.

Various layers of a display stack (such as the cover sheet 105, display 104, touch sensor layer, and so on) may be adhered together with an optically transparent adhesive and/or may be supported by a common frame or portion of the enclosure 102. A common frame may extend around a perimeter, or a portion of the perimeter, of the layers, may be segmented around the perimeter, a portion of the perimeter, or may be coupled to the various layers of the display stack in another manner.

In some embodiments, each of the layers of the display stack may be attached or deposited onto separate substrates that may be laminated or bonded to each other. The display stack may also include other layers for improving the structural or optical performance of the display 104, including, for example, polarizer sheets, color masks, and the like. Additionally, the display stack may include a touch sensor for determining the location of one or more touches on the input surface 106 of the electronic device 100. In some examples, the touch sensor may be a capacitive touch sensor configured to detect the location and/or area of one or more touches of a user's finger and/or a passive or active stylus on the input surface 106.

In many cases, the electronic device 100 can also include a processor, memory, power supply and/or battery, network connections, sensors, input/output ports, acoustic components, haptic components, digital and/or analog circuits for performing and/or coordinating tasks of the electronic device 100, and so on. One or more processors may be configured to perform, monitor, or coordinate one or more tasks of the electronic device 100. For example, a processor may be configured to operate, and/or communicate with, a force-sensitive structure having a strain-sensitive element such as described herein. For simplicity of illustration, the electronic device 100 is depicted in FIG. 1 without many of these components, each of which may be included, partially and/or entirely, within the enclosure 102. An example depiction of various internal components is provided below with respect to FIG. 15.

By way of example, the electronic device 100 is depicted as a cellular phone in FIG. 1. However, the systems and techniques described herein may be applied to other types of electronic devices, either stationary or portable, taking a larger or smaller form factor than illustrated. For example, in certain embodiments, the electronic device may be a laptop computer, a tablet computer, a cellular phone, a wearable device, a health monitoring device, a home or building automation device, a home or building appliance, a craft or vehicle entertainment, control, and/or information system, a navigation device, and so on.

As noted above, the electronic device 100 can also include one or more force-sensitive structures, which may be disposed within a force-sensing layer. The force-sensing layer may be positioned within the display stack or below the display 104. For simplicity of illustration, as with the example components of the electronic device 100 listed above, FIG. 1 is depicted without the force-sensing layer which may be included, partially and/or entirely, within the enclosure 102.

Figure 2:
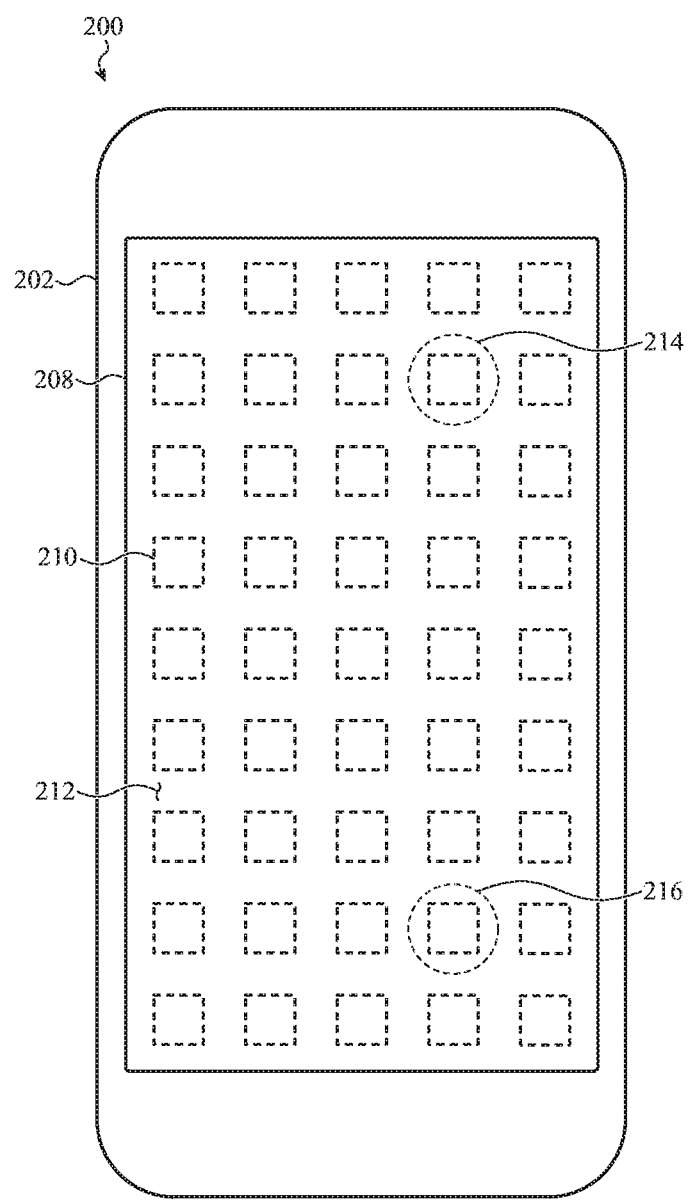
FIG. 2 depicts a cross-section of FIG. 1 viewed along line B-B, depicting a force-sensing layer within the electronic device.

FIG. 2 illustrates a cross-sectional view of the device 100 of FIG. 1 viewed along section B-B and illustrates a force-sensing layer 208 disposed within the enclosure 202 of the electronic device 200. The force-sensing layer 208 includes an array of force-sensitive structures 210 disposed on a substrate 212. While the force-sensitive structures 210 are depicted as squares in FIG. 2, it should be understood that this is for illustrative purposes, and the force-sensitive structures 210 may take on a variety of shapes.

In some embodiments, each force-sensitive structure 210 may be disposed on one or more surfaces of a substrate 212. For example, a single force-sensitive structure 210 may be formed on opposite sides of the substrate 212. The force-sensitive structure 210 may include a strain-sensitive element (e.g., a first strain-sensitive element) and one or more reference elements (e.g., a second, third, etc. strain-sensitive element). The strain-sensitive element may be configured to output an electrical response when the area of the force-sensing layer corresponding to the strain-sensitive element is put under strain, which may be in response to a deflection of the transparent cover or an exterior surface of the electronic device 200.

One or more reference elements are placed very near to the strain-sensitive element, and may be placed adjacent to the strain-sensitive element and on the same surface of the substrate 212, or a reference element may be placed opposite the strain-sensitive element on an opposing surface of the substrate 212. This configuration thermally couples the reference elements to the strain-sensitive element. The reference elements may be further configured such that a magnitude of the electrical response may be smaller as a result of the force-sensing layer 208 being strained, such that the reference elements can approximate thermal or other environmental changes in the strain-sensitive element and their effects on the electrical response of the strain-sensitive element.

Each force-sensitive structure 210 may further be coupled to force-sensing circuitry to measure or estimate an amount of strain registered along the corresponding portion of the force-sensing layer 208. The force-sensing circuitry may be electrically coupled to the strain-sensitive element and the one or more reference elements. The circuitry may further be configured to compare electrical responses in the strain-sensitive element with the reference elements in order to compensate for any temperature or other environmental effects on the response of the strain-sensitive element. The circuitry may then output a temperature-compensated electrical response or electrical signal that estimates or represents a temperature-compensated strain in the corresponding area of the force-sensing layer 208.

As an example of the temperature-compensation function of the force-sensing circuitry, a first region 214 of the force-sensing layer 208 may experience an elevated temperature from a second region 216 of the force-sensing layer 208. The difference in temperature may be a result of proximity to heat-producing underlying components, the presence of a user's finger in thermal contact with the transparent cover of the electronic device 200, or other environmental conditions.

Assuming an array of force-sensitive structures 210 is implemented without temperature compensation, a deflection in the transparent cover equidistant between the first region 214 and second region 216 may result in equal strain in the force-sensing layer 208 across the two regions. If the temperature of the two regions is the same the response of strain-sensitive elements in the two regions may be the same. However, without temperature compensation and with a higher temperature in the first region 214 than the second region 216, even though the strain in the force-sensing layer 208 across the regions may be the same, the electrical response of a strain-sensitive element in the first region 214 may be higher than the response of a strain-sensitive element in the second region 216.

Because of this temperature-dependent response, the force-sensitive structures 210 may be configured to compensate for local and/or ambient variations in temperature.

In one implementation, each force-sensitive structure 210 includes one or more reference elements, which may be used to reduce or eliminate variations due to temperature. The reference elements may be configured to be less responsive to strain and, therefore, may produce an electrical response that is primarily due to variations in environmental conditions like temperature. Using a differential measurement, the electrical response of one or more reference elements may be used to compensate for thermal effects within the force-sensitive structure 210.

With respect to the temperature variation example, a force-sensitive structure 210 in the first region 214 may have a strain-sensitive element which exhibits a higher electrical response than a corresponding strain-sensitive element in the second region 216 due to temperature difference. Using the electrical response from a corresponding reference element, the increase due to the temperature difference may be compensated for or reduced. The compensation may be performed using force-sensing circuitry, in accordance with some embodiments, which may output temperature-compensated signals from force-sensitive structures 210 in the first region 214 and second region 216.

Turning in further detail to the force-sensitive structure, FIGS. 3-12C depict various examples of force-sensitive structures. A force-sensitive structure includes a strain-sensitive element which exhibits a higher electrical response to strain along a direction and one or more reference elements which exhibit a lower electrical response to strain along the direction. In many embodiments, the force-sensitive structure is disposed on a substrate which may be strained along a series of paths in response to force being applied to the input surface of the electronic device. The force-sensitive structure may be aligned on the substrate such that the direction of the higher electrical response of the strain-sensitive element may be aligned with one of the set of strain paths, as further illustrated in FIGS. 13-14.

Figure 3:
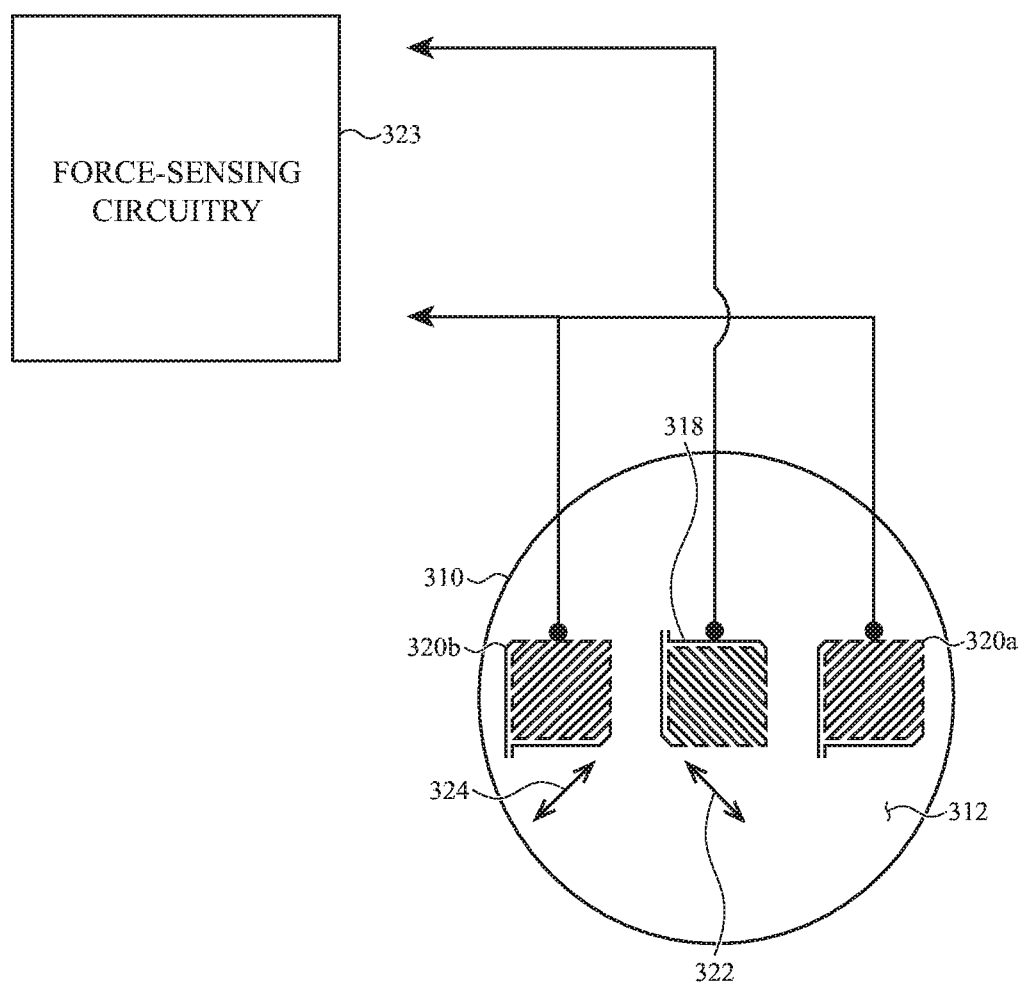
FIG. 3 depicts an example force-sensitive structure.

FIG. 3 illustrates a simplified model of a force-sensitive structure 310, including a strain-sensitive element 318 configured to exhibit a primary sensitivity to strain along a first direction 322 and reference elements 320a, 320b positioned proximate to the strain-sensitive element 318 and configured to exhibit a smaller response to strain along the first direction 322, or exhibit a primary sensitivity to strain along a second direction transverse to the first direction. Also illustrated is a schematic of the strain-sensitive element 318 and reference elements 320a, 320b electrically coupled to force-sensing circuitry 323. The force sensing circuitry 323 may include a voltage divider and balancing network to form a Wheatstone bridge in order to compensate for temperature variation within the force-sensitive structure 310.

FIG. 3 thus illustrates a force-sensitive structure 310 which includes a strain-sensitive element (e.g., a first strain-sensitive element) 318 formed on a substrate 312. The strain-sensitive element 318 is depicted with a resistive structure having an array of major parallel lines (e.g., traces) of conductive material along a first direction 322 connected by minor lines of the same material in order to induce an electrical response in the strain-sensitive element 318 when strain is applied along the first direction 322. A first reference element (e.g., a second strain-sensitive element) 320a is formed on the same surface of the substrate 312 proximate to the strain-sensitive element 318. A second reference element (e.g., a third strain-sensitive element) 320b is formed on the same surface of the substrate 312 proximate to the strain-sensitive element 318 and opposite the first reference element 320a. Both reference elements 320a, 320b are depicted with a resistive structure having an array of major parallel lines of conductive material along a second direction 324, which may be transverse or orthogonal to the first direction 322 in order to induce a smaller electrical response in the reference elements 320a, 320b when strain is applied to the force-sensitive structure 310 along the first direction 322.

The strain-sensitive element 318 and reference elements 320a, 320b may be formed from the same conductive material and be disposed in the same pattern but arranged and aligned transverse or orthogonal to one another. In this configuration, the strain-sensitive element 318 and reference elements 320a, 320b may be thermally matched and thermally coupled by their proximity such that changes in environmental conditions affect the strain-sensitive element 318 and the reference elements 320a, 320b in substantially the same manner. When connected to force-sensing circuitry 323, any variation in electrical response in the strain-sensitive element 318 introduced by environmental conditions (e.g., temperature change) can be reduced or compensated for by the electrical response of the reference elements 320a, 320b, for example by using a Wheatstone bridge.

In one example of force-sensing circuitry 323, the strain-sensitive element 318 and reference elements 320a, 320b may be coupled to one or more legs of a Wheatstone bridge or similar circuitry configured to measure a change in resistance or other electrical response. In the example illustrated the reference elements 320a, 320b are coupled to a same node of the force-sensing circuitry 323 (e.g., in parallel to form a leg of a Wheatstone bridge), but in other embodiments the reference elements 320a, 320b may be separately coupled to the force-sensing circuitry 323 in a different configuration.

Two additional legs of the bridge may each include a reference resistor. A current through the bridge may be monitored to determine the variable resistance of the strain-sensitive element 318 and/or reference elements 320a, 320b. In some cases, the resistance ratio of the reference resistors may be equal to the resistance ratio of the unstrained elements 318, 320a, 320b. The resistance ratio of the elements 318, 320a, 320b may remain the same as temperature varies, but the resistance ratio may change in response to strain exhibited at the strain-sensitive element, causing a change in current through the bridge which may be measured as strain at the strain-sensitive element. In this or a similar manner the force-sensing circuitry 323 may measure a temperature-compensated force applied to the input surface of the electronic device.

The conductive material of the strain-sensitive element 318 and reference elements 320a, 320b may include materials such as, but not limited to: copper, gold, constantan, karma, isoelastic, indium tin oxide, or any combination thereof. The substrate 312 on which the conductive material is deposited may include materials such as, but not limited to: plastic, metal, ceramic, glass, polyimide, polyethylene terephthalate, or any combination thereof. The conductive material of the strain-sensitive element 318 and reference elements 320a, 320b may be formed or deposited on a surface using a suitable disposition technique such as, but not limited to: vapor deposition, sputtering, printing, roll-to-roll processing, gravure, pick and place, adhesive, mask-and-etch, and so on.

In some cases, the strain-sensitive element 318 and reference elements 320a, 320b are formed in two stages of the same manufacturing process. In other cases, the strain-sensitive element 318 and reference elements 320a, 320b are formed simultaneously onto the substrate. In many embodiments, the force-sensitive structure 310 may be disposed in an optically opaque layer (e.g., below a display). In these embodiments, the material of the strain-sensitive element 318, the reference elements 320a, 320b, and the substrate 312 may be formed from non-transparent materials. In other embodiments, it may be preferable for the conductive material and substrate to be made from optically transparent materials (e.g., where the force-sensing layer is above the display).

Figure 4A:
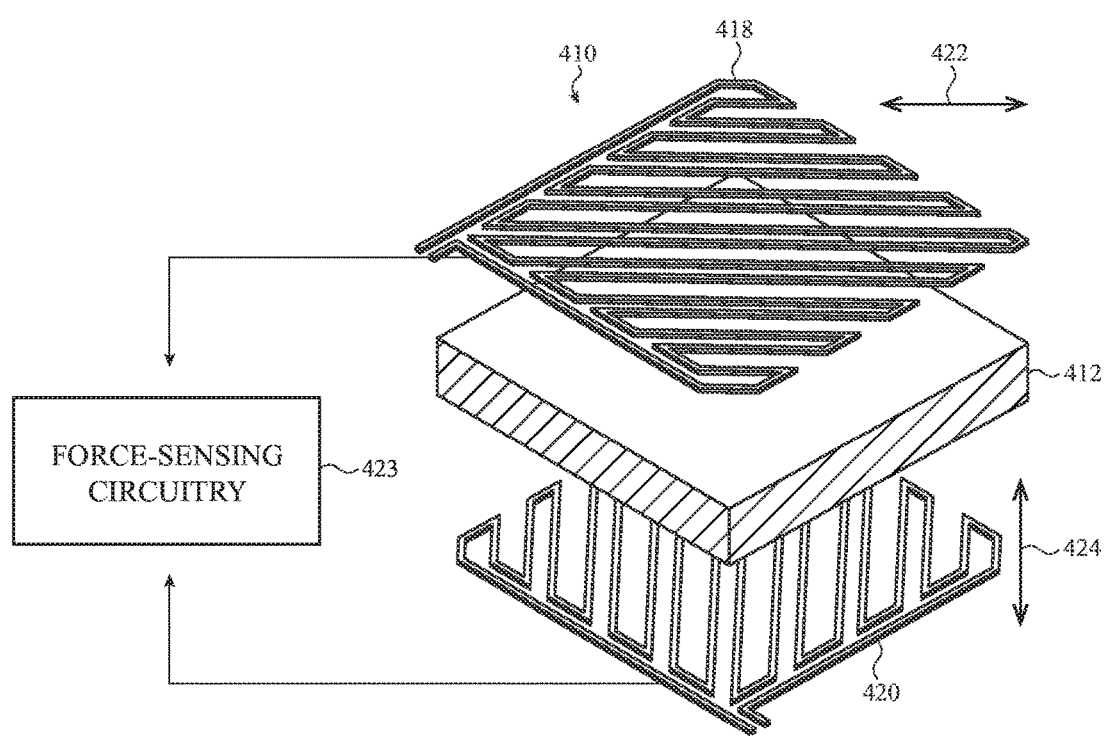
FIGS. 4A-4C depict additional example force-sensitive structures.
Figure 4B:
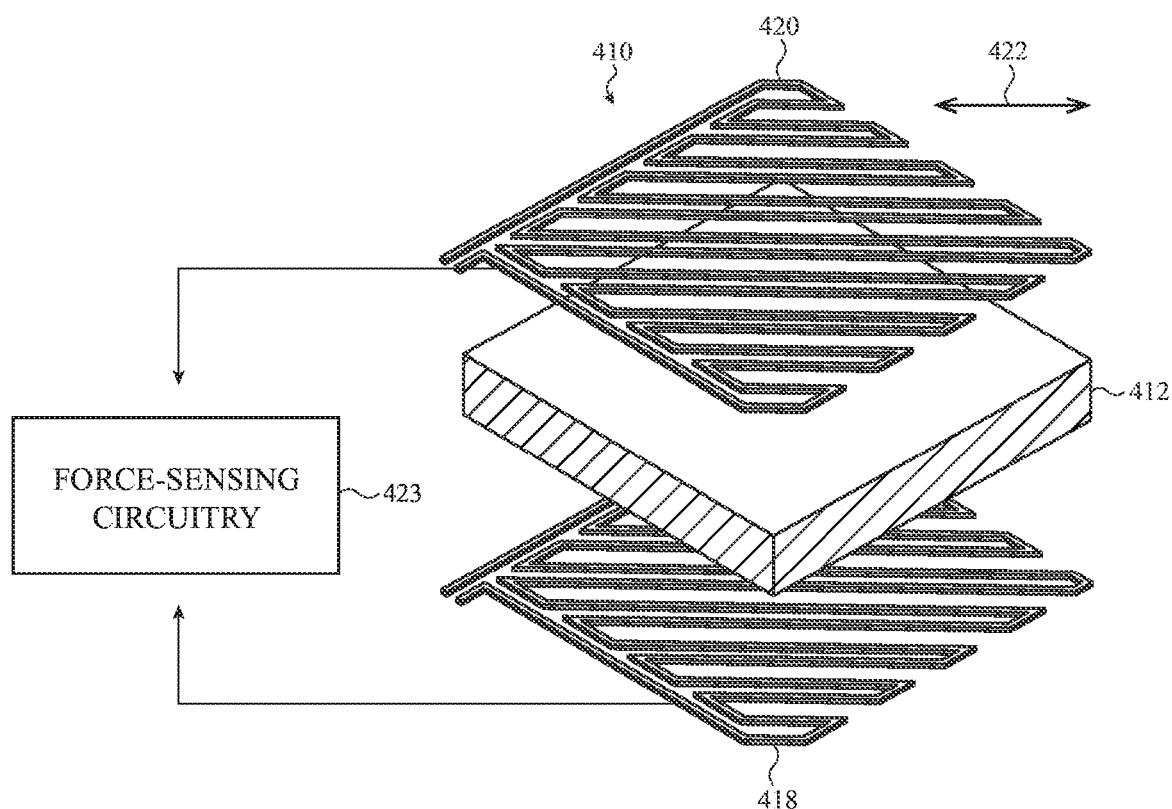
Figure 4C:
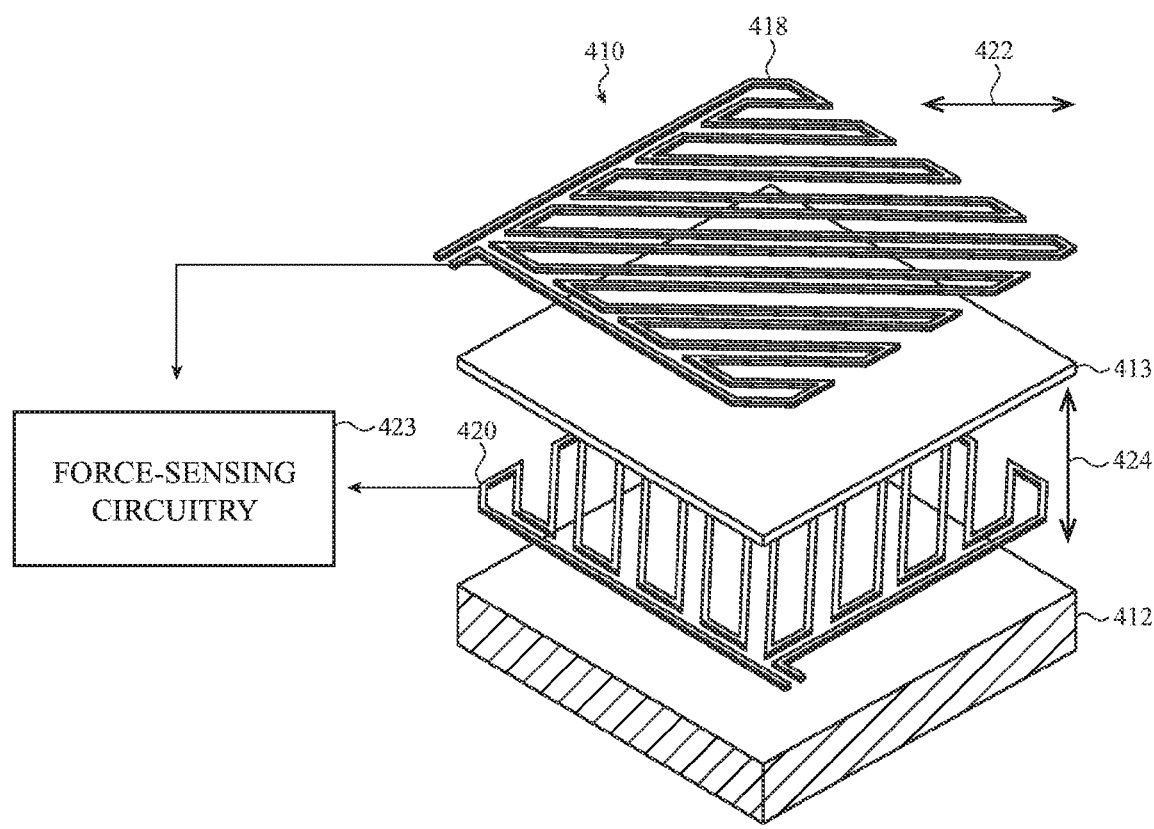

FIGS. 4A-4C illustrate example force-sensitive structures 410 having pairs of strain-sensitive elements 418 and reference elements 420 within separate layers of the force-sensitive structures. Each of FIGS. 4A-4C also illustrates a schematic of a strain-sensitive element 418 and reference element 420 electrically coupled to force-sensing circuitry 423. The force sensing circuitry 423 may include a voltage divider and balancing network to form a Wheatstone bridge in order to compensate for temperature variation within the force-sensitive structure 410 (such as described above with respect to FIG. 3).

FIG. 4A illustrates an exploded view of a force-sensitive structure 410 which includes a strain-sensitive element (e.g., a first strain-sensitive element) 418 formed on a first side of a substrate 412. The strain-sensitive element 418 is configured to exhibit sensitivity to strain along a first direction 422. The strain-sensitive element is depicted with a resistive structure having an array of major parallel lines (e.g., traces) of conductive material along the first direction 422 connected by minor lines of the same material in order to induce an electrical response in the strain-sensitive element 418 when strain is applied along the first direction 422.

A reference element (e.g., a second strain-sensitive element) 420 is formed on a second side of the substrate 412 opposite the strain-sensitive element 418. The reference element 420 is configured to have a smaller response to strain along the first direction 422, or configured to exhibit sensitivity to strain along a second direction 424. The reference element 420 is depicted with a resistive structure having an array of major parallel lines of conductive material along the second direction 424, which may be transverse or orthogonal to the first direction 422 in order to induce a smaller electrical response in the reference element 420 when strain is applied to the force-sensitive structure 410 along the first direction 422.

Similar to the example illustrated in FIG. 3, the strain-sensitive element 418 and reference element 420 may be formed with the same conductive material and be disposed in the same pattern but arranged and aligned transverse or orthogonal to one another. In this configuration, the strain-sensitive element 418 and reference element 420 may be thermally matched and thermally coupled across the substrate 412 such that changes in environmental conditions affect the strain-sensitive element 418 and reference element 420 in substantially the same manner. When connected to force-sensing circuitry 423, any variation in electrical response in the strain-sensitive element 418 introduced by environmental conditions (e.g., temperature change) can be reduced or compensated for by the electrical response of the reference element 420, for example by using a Wheatstone bridge. As with the example illustrated in FIG. 3, the substrate and conductive material of the strain-sensitive element 418 and reference element 420 may include a variety of materials, including optically opaque materials.

In other embodiments, as illustrated in FIG. 4B, the strain-sensitive element 418 and reference element 420 may be configured to exhibit sensitivity to strain along non-orthogonal directions, including along a same direction. The force-sensitive structure 410 illustrated in FIG. 4B includes a strain-sensitive element (e.g., a first strain-sensitive element) 418 formed on a first side of a substrate 412. The strain-sensitive element 418 is configured to exhibit sensitivity to strain along direction 422, and may have an array of major parallel lines (e.g., traces) of conductive material along the first direction 422 connected by minor lines of the same material.

A reference element (e.g., a second strain-sensitive element) 420 is formed on a second side of the substrate 412 opposite the strain-sensitive element 418. The reference element 420 is configured to exhibit sensitivity to strain along the same direction 422 as the strain-sensitive element 418, and may have an array of major parallel lines of conductive material along the same direction 422. When strain is applied along the direction 422 of sensitivity, both the strain-sensitive element 418 and the reference element 420 may exhibit an electrical response which can be measured by the force-sensing circuitry 423.

In some embodiments, the force-sensitive structure 410 depicted in FIG. 4B may be bonded to one or more additional layers (see FIGS. 9A-10B). Due to the bonding, when a force is applied at the input surface, the neutral axis of the compressive system may be above the force-sensitive structure 410. Accordingly, the strain-sensitive element 418 and the reference element 420 may both be placed under tension, with the strain-sensitive element 418 experiencing a larger amount of tension as it is positioned further below the neutral axis of the compressive system.

The strain-sensitive element 418 and reference element 420 may be formed with the same conductive material and disposed in the same pattern and orientation. In this configuration, the strain-sensitive element 418 and reference element 420 may be thermally matched and thermally coupled across the substrate 412 such that changes in environmental conditions affect the strain-sensitive element 418 and reference element 420 in substantially the same manner. Thus the electrical response of the strain-sensitive element 418 and the reference element 420 may be approximately the same. When placed under strain, however, the larger tension experienced by the strain-sensitive element 418 may be measured by force-sensing circuitry 423. The force-sensing circuitry 423 may subtract or otherwise compare the electrical response of the reference element 420 from the response of the strain-sensitive element 418 (e.g., by using a Wheatstone bridge), yielding a temperature-compensated strain measurement. As with the example illustrated in FIG. 3, the substrate 412 and conductive material of the strain-sensitive element 418 and reference element 420 may include a variety of materials, including optically opaque materials.

As depicted in FIG. 4C, in other embodiments the strain-sensitive element 418 and the reference element 420 may be positioned in a stacked configuration on a same side of the substrate 412. The force-sensitive structure 410 illustrated in FIG. 4C includes a strain-sensitive element (e.g., a first strain-sensitive element) 418 formed on a first side of a thin dielectric layer 413. The strain-sensitive element 418 is configured to exhibit sensitivity to strain along a first direction 422. The strain-sensitive element 418 is depicted with a resistive structure having an array of major parallel lines (e.g., traces) of conductive material along the first direction 422 connected by minor lines of the same material in order to induce an electrical response in the strain-sensitive element 418 when strain is applied along the first direction 422.

A reference element (e.g., a second strain-sensitive element) 420 is formed below the strain-sensitive element 418, with the thin dielectric layer 413 disposed between the strain-sensitive element 418 and the reference element 420. The dielectric layer 413 may be formed from an appropriate material, such as, but not limited to: plastic, metal, ceramic, glass, polyimide, polyethylene terephthalate, or any combination thereof. The reference element 420 may be deposited or otherwise disposed on a second side of the thin dielectric layer 413 opposite the strain-sensitive element 418, with the thin dielectric layer 413 being affixed to the substrate 412 by an adhesive layer. In some embodiments, the reference element 420 may be formed on a surface of the substrate 412, to which the thin dielectric layer 413 is affixed by an adhesive layer.

The reference element 420 is configured to have a smaller response to strain along the first direction 422, or configured to exhibit sensitivity to strain along a second direction 424. The reference element 420 is depicted with a resistive structure having an array of major parallel lines of conductive material along the second direction 424, which may be transverse or orthogonal to the first direction 422 in order to induce a smaller electrical response in the reference element 420 when strain is applied to the force-sensitive structure 410 along the first direction 422.

Similar to the example illustrated in FIG. 3, the strain-sensitive element 418 and reference element 420 may be formed with the same conductive material and be disposed in the same pattern but arranged and aligned transverse or orthogonal to one another. In this configuration, the strain-sensitive element 418 and reference element 420 may be thermally matched and thermally coupled across the thin dielectric layer 413 such that changes in environmental conditions affect the strain-sensitive element 418 and reference element 420 in substantially the same manner. When connected to force-sensing circuitry 423, any variation in electrical response in the strain-sensitive element 418 introduced by environmental conditions (e.g., temperature change) can be reduced or compensated for by the electrical response of the reference element 420, for example by using a Wheatstone bridge. As with the example illustrated in FIG. 3, the substrate and conductive material of the strain-sensitive element 418 and reference element 420 may include a variety of materials, including optically opaque materials.

Figure 5A:
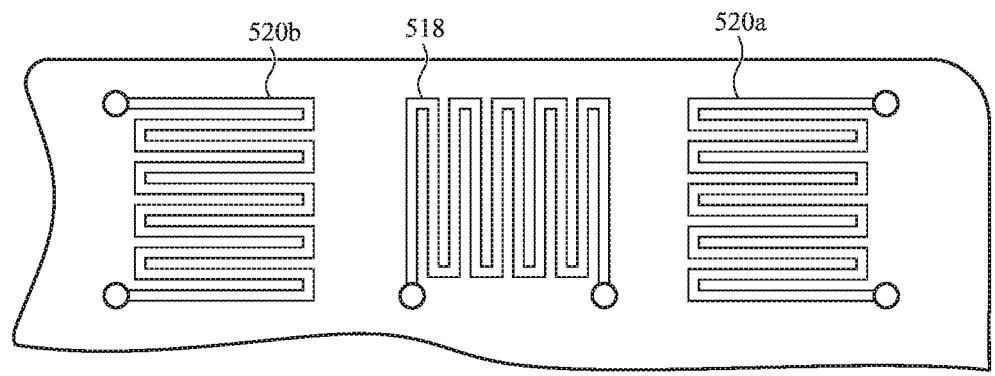
FIGS. 5A-5D depict other example configurations for force-sensitive structures.
Figure 5B:
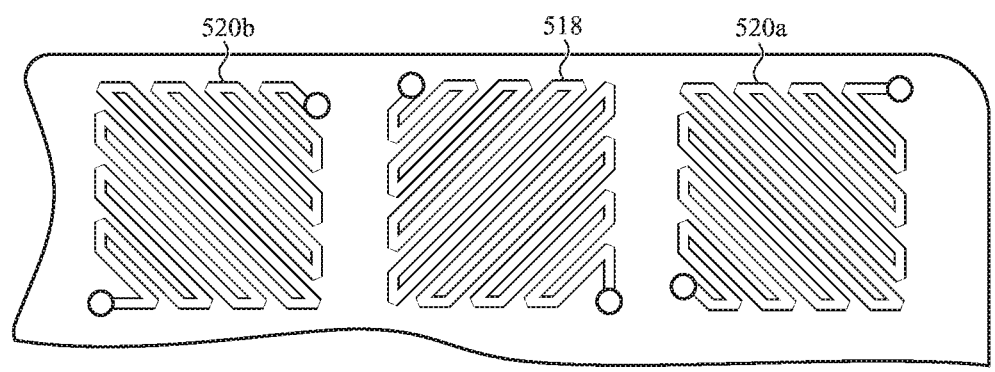

FIGS. 5A-5D illustrate other example configurations for force-sensitive structures according to the force-sensitive structure of FIGS. 3 and 4. FIGS. 5A and 5B illustrate different optional serpentine geometries for resistive structures on the same side of a substrate (similar to the example embodiment of FIG. 3), but each can also be applied to force-sensitive structures having strain-sensitive elements and reference elements on opposite sides of a substrate (similar to the example embodiments of FIGS. 4A and 4B) or in a stacked configuration on a side of a substrate (similar to the example embodiment of FIG. 4C).

FIG. 5A illustrates serpentine geometries for a strain-sensitive element 518 and reference elements 520a, 520b, the strain-sensitive element 518 being sensitive to strain along the Y-axis. The reference elements 520a, 520b are arranged orthogonal to the strain-sensitive element 518. In this manner, when the reference elements 520a, 520b are strained in the Y-axis direction, the reference elements 520a, 520b may not experience substantial tension in order to serve as a thermal reference for the strain-sensitive element 518.

Similarly, FIG. 5B illustrates a serpentine geometry for a strain-sensitive element 518 which may be sensitive to strain along a 45 degree angle. The reference elements 520a, 520b are arranged at a 135 degree angle (orthogonal to the serpentine geometry) in order to be minimally strained along the 45 degree angle. In many embodiments, the angle or combination of angles of orientation for different strain-sensitive elements may be selected, at least in part based on the location of the particular strain-sensitive element along the surface of the force-sensing layer. The orientation of strain-sensitive elements within the force-sensing layer is further illustrated with reference to FIGS. 13 and 14.

Figure 5C:
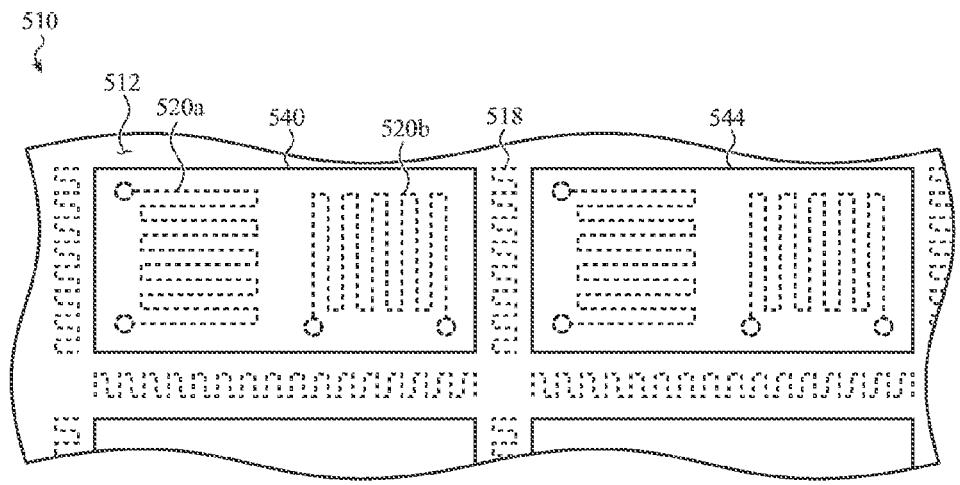
Figure 5D:
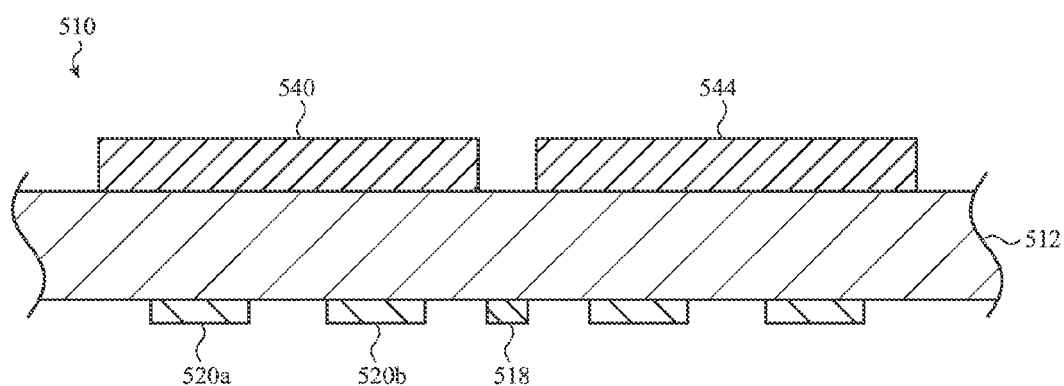

FIGS. 5C and 5D illustrate another example configuration of a force-sensitive structure 510, having stiffeners to concentrate force at particular regions of the substrate 512. FIG. 5C illustrates a transparent top view of the force-sensitive structure 510, while FIG. 5D illustrates a cross-sectional view of the force-sensitive structure 510. An array of stiffeners 540, 544 are disposed on a top surface of the substrate 512, while strain-sensitive elements 518 and reference elements 520a, 520b are disposed on a bottom surface of the substrate 512.

As depicted in FIGS. 5C and 5D, one or more reference elements 520a, 520b are positioned below each stiffener 540. A strain-sensitive element 518 is positioned between two stiffeners 540, 544, and additional strain-sensitive elements 518 may be positioned between any two adjacent stiffeners 540, 544 within the array. When strain is applied to the force-sensitive structure 510, the stiffeners 540, 544 concentrate strain to the region of the substrate 512 between stiffeners 540, 544. Thus, strain may be concentrated at the strain-sensitive element 518.

The reference elements 520a, 520b, being directly below a stiffener 540, may be isolated from strain applied to the force-sensitive structure 510. The reference elements 520a, 520b may further be thermally coupled to a nearby strain-sensitive element 518 such that one or more reference elements 520a, 520b may provide a temperature reference to the strain-sensitive element 518. In some embodiments, a first reference element 520a may be configured to be sensitive to strain along a first direction while a second reference element 520b is configured to be sensitive to strain along a direction orthogonal to the first direction. In other embodiments, the reference elements 520a, 520b may be sensitive to strain along the same direction. Further examples of embodiments with stiffener elements are illustrated below with respect to FIGS. 11C and 12C.

Figure 6A:
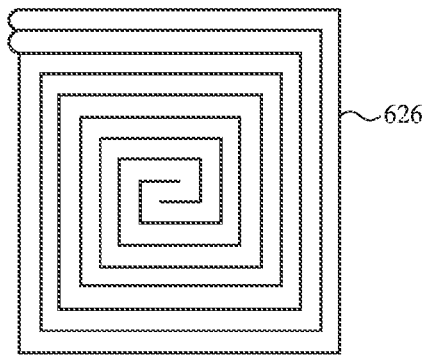
FIGS. 6A-6E depict force-sensitive structures with spiral patterns.
Figure 6B:
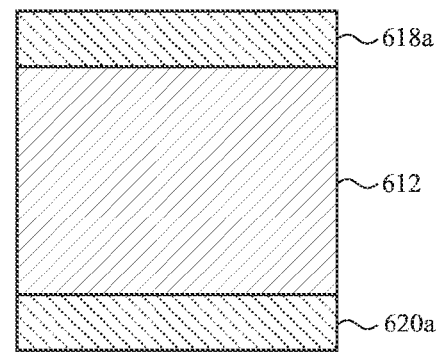

Still other force-sensitive structures are illustrated in FIGS. 6A-6E. FIGS. 6A-6E illustrate spiral patterns which may be implemented using indium tin oxide or another conductive material. FIG. 6A illustrates a spiral pattern 626 which may be positioned in the illustrated orientation to form a strain-sensitive element 618a on one surface of a substrate 612. The same pattern may be rotated 90 degrees and positioned on the opposite surface of the substrate 612 to form a reference element 620a, as illustrated in FIG. 6B.

Figure 6C:
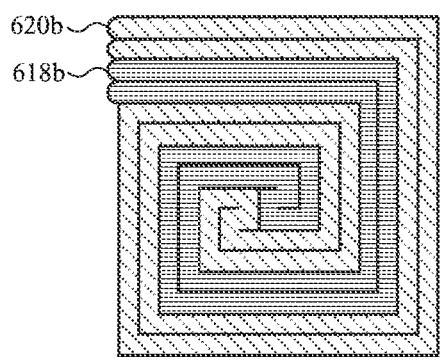
Figure 6D:
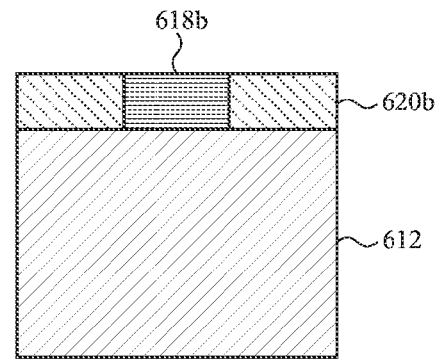
Figure 6E:
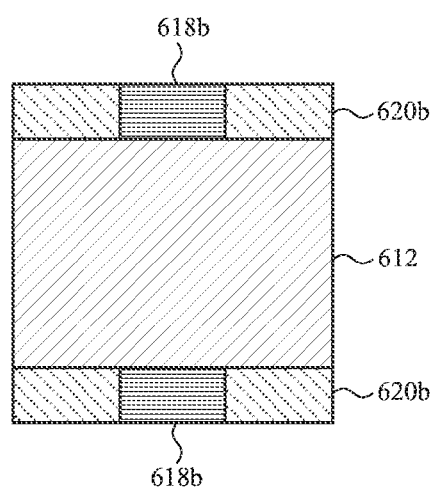

Alternatively, two similar spiral patterns may be interlocked, as illustrated in FIG. 6C, to form a strain-sensitive element 618b and a reference element 620b. This pattern may allow both the strain-sensitive element 618b and reference element 620b to be deposited on one side of a substrate 612, as illustrated in FIG. 6D. In other embodiments, it may be desirable to form interlocking strain-sensitive elements 618b and reference elements 620b on both sides of the substrate 612, as illustrated in FIG. 6E.

Figure 7:
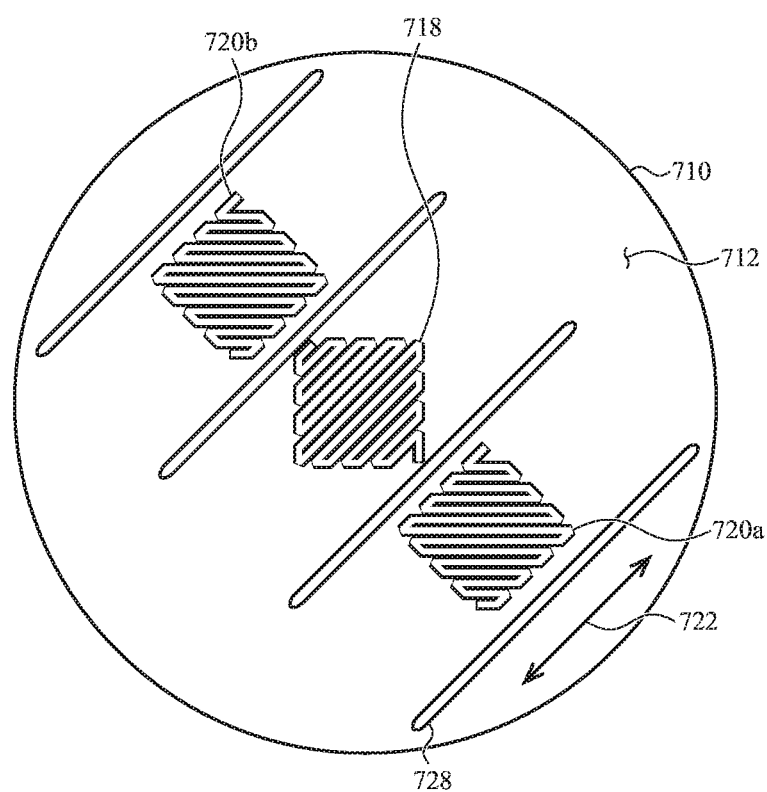
FIGS. 7-8 depict additional features which may be formed in a force-sensing layer.
Figure 8:
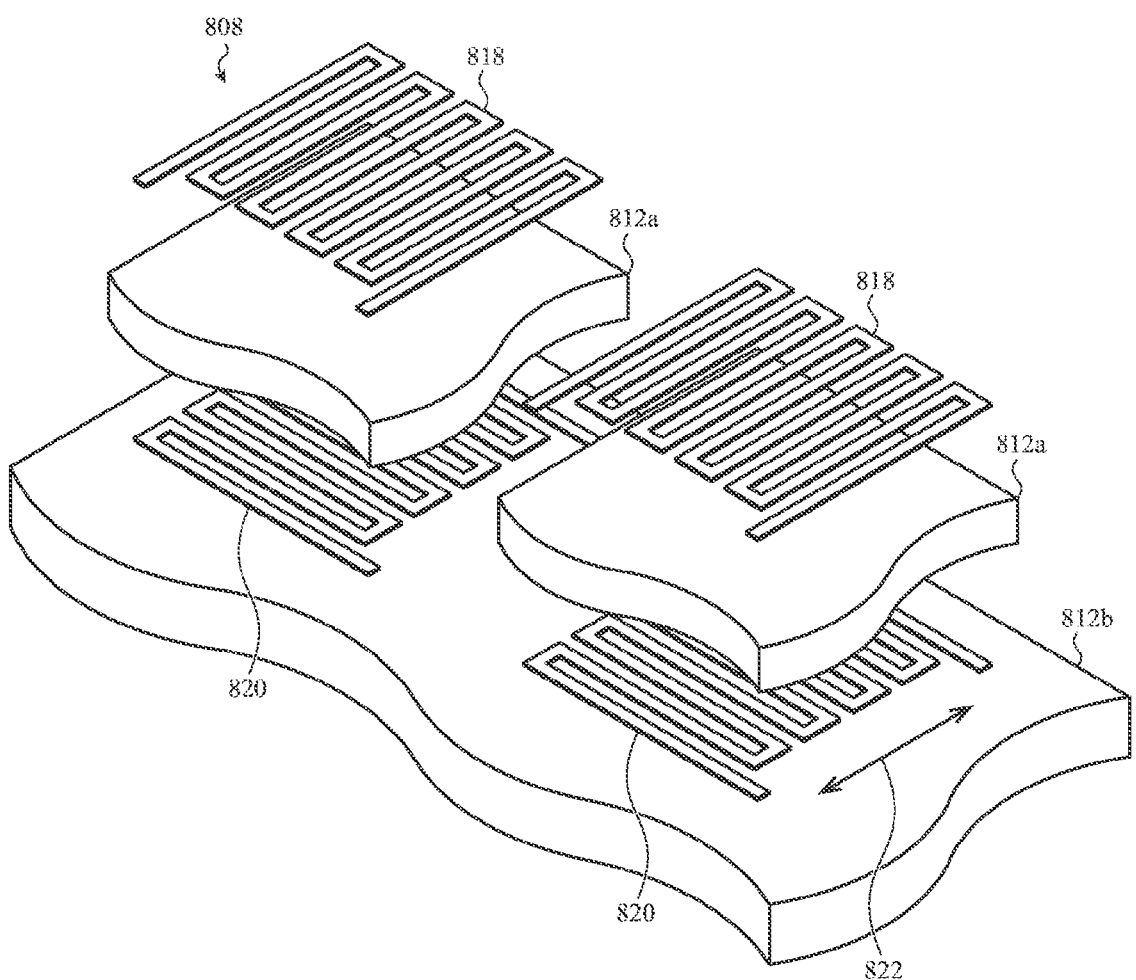

The performance of force-sensitive structures may be improved by cutting, etching, or otherwise forming reliefs in the substrate, as illustrated in FIGS. 7-8. These reliefs may isolate and/or amplify the electrical response of a strain-sensitive element in response to applied strain along a primary direction while maintaining the reference elements in thermal contact with the strain-sensitive element. The reliefs may further act as strain-breaks within the force-sensing layer to reduce the effect of strain along non-primary directions within a force-sensitive structure.

For example, FIG. 7 illustrates a force-sensitive structure 710 within a force-sensing layer similar to the embodiment illustrated in FIG. 3. The force-sensitive structure 710 of FIG. 7 includes a substrate 712 with a strain-sensitive element 718 configured to respond to strain along a first direction 722 and reference elements 720a, 720b positioned proximate to the strain-sensitive element 718 and configured to have a smaller response to strain along the first direction 722.

The force-sensitive structure 710 of FIG. 7 further includes several reliefs 728 within the substrate 712. The reliefs 728 are configured as linear trenches (e.g., slits) along the first direction 722, which may be a primary direction of sensitivity of the strain-sensitive element 718. The reliefs 728 may have a length greater than a corresponding length of the strain-sensitive element 718 and/or reference elements 720a, 720b. In other embodiments, the reliefs 728 may have other lengths, including a length equal to or less than the strain-sensitive element 718 and/or reference elements 720a, 720b. The reliefs 728 may have a rectangular cross section, while in other embodiments the reliefs 728 may have a rounded cross section or another suitable geometric shape. The reliefs 728 may be formed in the substrate 712 by an appropriate means, such as molding, cutting, etching, etc.

The reliefs 728 are positioned on the sides of each of the strain-sensitive element 718 and the reference elements 720a, 720b in order to reduce the electrical response of the strain-sensitive element 718 and reference elements 720a, 720b in response to strain along non-primary directions. These reliefs 728 are further illustrated below with respect to FIGS. 11B and 13.

As another example, FIG. 8 illustrates an exploded view of two force-sensitive structures within a force-sensing layer 808 similar to the embodiment illustrated in FIG. 4A. Each force-sensitive structure includes a strain-sensitive element 818 configured to respond to strain along a first direction 822 and a reference element 820 positioned opposite the strain-sensitive element 818 and configured to have a smaller response to strain along the first direction 822.

The substrate of the force-sensing layer 808 depicted in FIG. 8 may have a first layer 812a and a second layer 812b. The strain-sensitive elements 818 may be on a surface of the first layer 812a and the reference elements 820 may be between the first layer 812a and second layer 812b. There may further be a relief formed through the first layer 812a between each force-sensitive structure in order to reduce the electrical response of the strain-sensitive elements 818 and reference elements 820 in response to strain along non-primary directions. The relief may be substantially similar to the relief described with respect to FIG. 7.

Figure 9A:
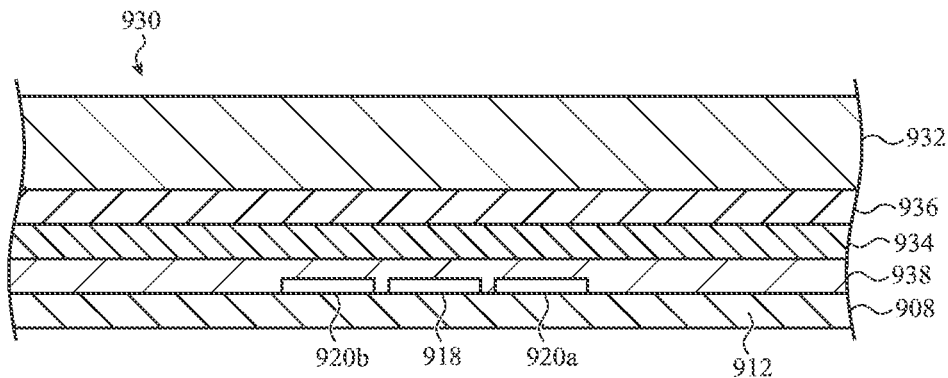
FIGS. 9A-9B depict a cross-sectional view of the electronic device of FIG. 1, viewed along line A-A, according to an example embodiment as depicted in FIG. 3.
Figure 9B:
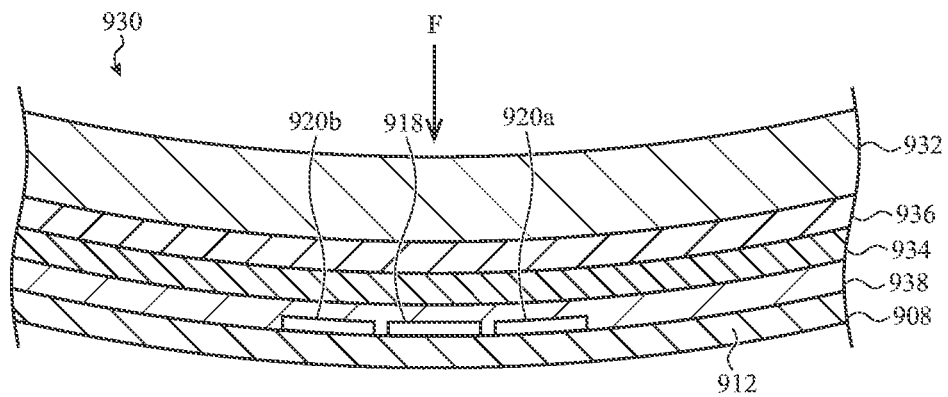

FIGS. 9A-9B illustrate a cross-sectional view of the electronic device of FIG. 1, viewed along line A-A, according to an example embodiment as depicted in FIG. 3. For example, with reference to FIG. 9A there is shown a cross-section of a force-sensitive structure, specifically showing one example of a force-sensitive structure with a strain-sensitive element 918 and a pair of reference elements 920a, 920b on a side of a substrate 912. The force-sensitive structure is on a force-sensing layer 908 positioned in a lower portion of a display stack 930 of an electronic device. Generally and broadly, the embodiment depicted in FIG. 9A shows a temperature-compensating force-sensitive structure disposed on a bottom surface of the display stack 930.

As noted above, a display stack, such as the display stack 930, typically includes one or more layers of material bonded together with optically clear adhesives. For example, the display stack 930 can include a transparent cover sheet layer 932 and an organic light emitting diode layer (e.g., a display layer) 934 positioned below the transparent cover sheet layer 932. The display stack 930 may also include a touch sensor layer 936, which may be positioned above or below the organic light emitting diode layer 934.

The force-sensing layer 908 is coupled to the underside of the organic light emitting diode layer 934 with an adhesive layer 938. In this example, the force-sensing layer 908 may be formed from optically opaque materials. The force-sensing layer 908 includes a substrate 912. A strain-sensitive element 918 is formed on the substrate 912, and may be either adjacent to the organic light emitting diode layer 934 (as shown) or opposite the organic light emitting diode layer 934. Reference elements 920a, 920b are positioned proximate to the strain-sensitive element 918. The strain-sensitive element 918 may be sensitive to strain along a primary direction, while the reference elements 920a, 920b may be sensitive to strain along a direction transverse to the primary direction.

Turning to FIG. 9B, as a force F is applied to the display stack 930, the substrate 912 may be placed under greater strain along the primary direction of sensitivity of the strain-sensitive element 918. This may result in a greater electrical response (e.g., a larger change in resistance) in response to the strain in the strain-sensitive element 918 than the electrical response of the reference elements 920a, 920b.

In another embodiment, the strain-sensitive element 1018 may be positioned on a first side of the force-sensing layer 1008 while the reference element 1020 may be positioned on an opposite side of the force-sensing layer 1008. For example, with reference to FIGS. 10A-10B, there is shown a cross-sectional view of the electronic device of FIG. 1, viewed along line A-A and showing a force-sensitive structure according to an example embodiment as depicted in FIG. 4A.

Figure 10A:
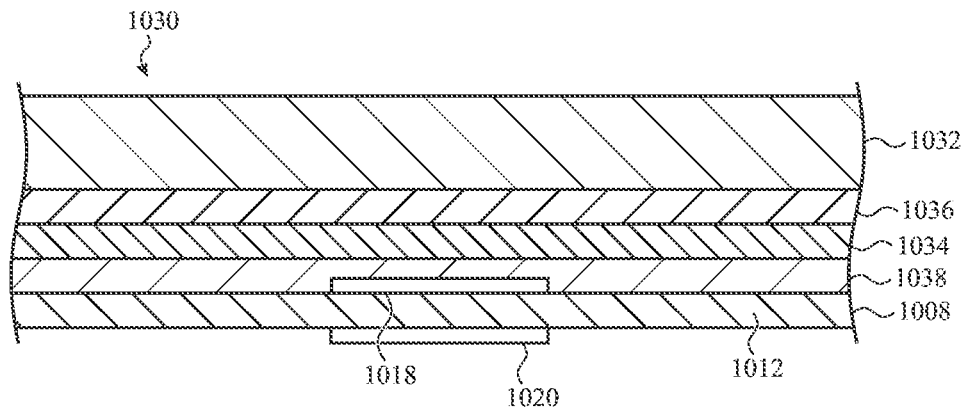
FIGS. 10A-10B depict a cross-sectional view of the electronic device of FIG. 1, viewed along line A-A, according to an example embodiment as depicted in FIG. 4A.

FIG. 10A shows an example of a force-sensitive structure with a strain-sensitive element 1018 on a first side of a substrate 1012 and a reference element 1020 on a second side of the substrate 1012 opposite the strain-sensitive element 1018. The force-sensitive structure is on a force-sensing layer 1008 disposed below a display stack 1030 of an electronic device. Generally and broadly, the embodiment depicted in FIG. 10A shows a temperature-compensating force-sensitive structure disposed on a bottom surface of the display stack 1030.

As illustrated in FIG. 10A, the display stack 1030 can include a transparent cover sheet layer 1032 and an organic light emitting diode layer (e.g., a display layer) 1034 positioned below the transparent cover sheet layer 1032. The display stack 1030 may also include a touch sensor layer 1036, which may be positioned above or below the organic light emitting diode layer 1034.

The force-sensing layer 1008 is coupled to the underside of the organic light emitting diode layer 1034 with an adhesive layer 1038. In this example, the force-sensing layer 1008 may be formed from optically opaque materials. The force-sensing layer 1008 includes a substrate 1012. A strain-sensitive element 1018 is formed on the substrate 1012, and may be either adjacent to the organic light emitting diode layer 1034 (as shown) or opposite the organic light emitting diode layer 1034. A reference element 1020 is positioned on an opposite side of the substrate 1012. The strain-sensitive element 1018 may be sensitive to strain along a primary direction, while the reference element 1020 may be sensitive to strain along a direction transverse to the primary direction.

Figure 10B:
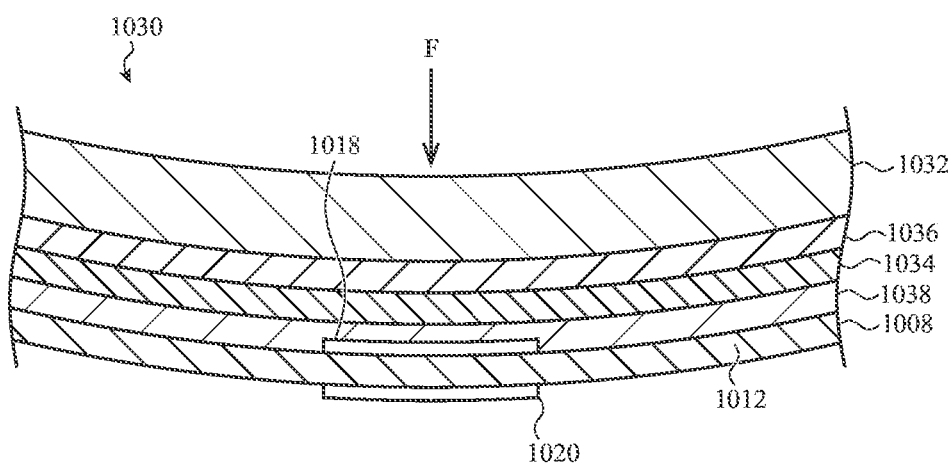

Turning to FIG. 10B, as a force F is applied to the display stack 1030, the substrate 1012 may be placed under greater strain along the primary direction of sensitivity of the strain-sensitive element 1018. This may result in a greater electrical response (e.g., a larger change in resistance) in response to the strain in the strain-sensitive element 1018 than the electrical response of the reference element.

In some examples, the strain-sensitive element 1018 and the reference element 1020 may be sensitive to strain along a same direction, similar to the embodiment depicted in FIG. 4B. The force-sensing layer 1008 may be bonded to the layers of the display stack 1030. Due to the bonding, when a force F is applied to the display stack 1030, the neutral axis of the compressive system may be above the force-sensing layer 1008. Accordingly, the strain-sensitive element 1018 and the reference element 1020 may both be placed under tension, with the strain-sensitive element 1018 experiencing a larger amount of tension as it is positioned further below the neutral axis of the compressive system. In other examples, the neutral axis of the compressive system may be within the substrate 1012. In these examples, the strain-sensitive element 1018 may be placed under compression and the reference element under tension in response to the force F being applied to the display stack 1030.

The force-sensing layer may further be a stack of sub-layers, as depicted in FIGS. 11A-11C and 12A-12C. The force-sensing layer may thus include a substrate layer and an adhesive layer, and may in some embodiments further include reliefs in the substrate layer and/or a stiffener layer.

Figure 11A:
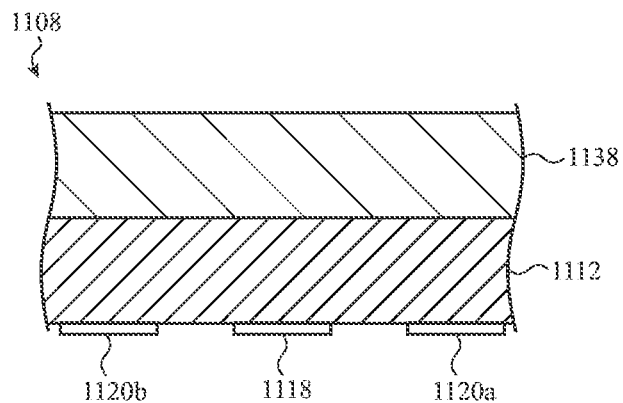
FIGS. 11A-11C depict examples of the force-sensing layer as a stack of further sub-layers.
Figure 11B:
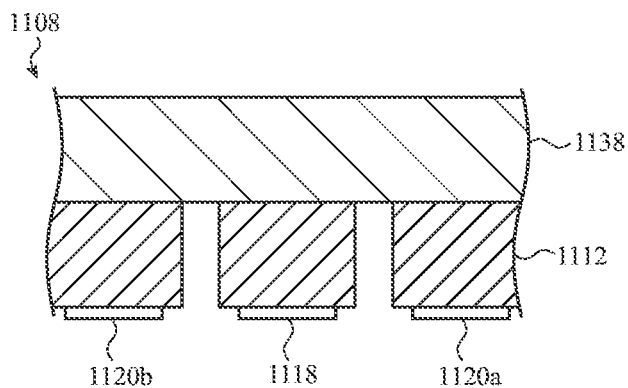
Figure 11C:
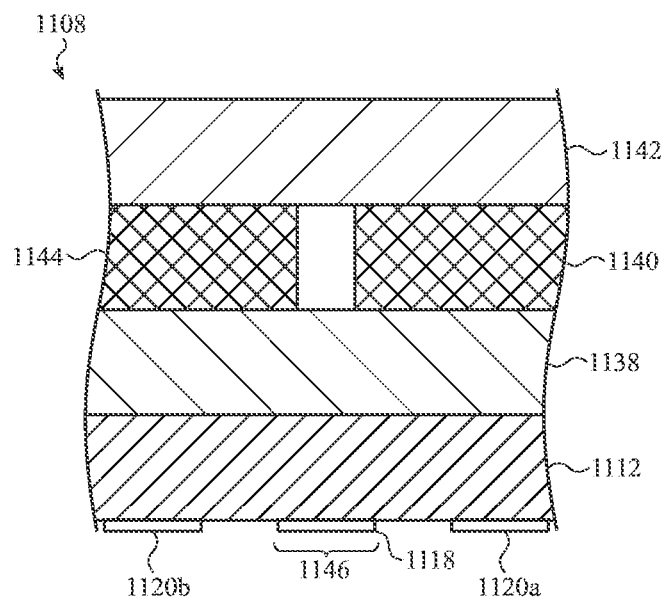

For example, FIGS. 11A-11C depict a force-sensing layer 1108 according to embodiments similar to the embodiment illustrated in FIG. 3. As depicted in FIG. 11A, the force-sensing layer 1108 includes a substrate layer 1112 with a strain-sensitive element 1118 formed on a surface of the substrate layer 1112. A pair of reference elements 1120a, 1120b are formed proximate to and on the same surface as the strain-sensitive element 1118. An adhesive layer 1138 is coupled to the substrate layer 1112. The adhesive layer 1138 may include a pressure-sensitive adhesive, or another adhesive which couples the substrate layer 1112 to the display stack such that a deflection in the transparent cover is transferred through the display stack and the adhesive layer 1138 to the substrate layer 1112.

FIG. 11B illustrates a force-sensing layer 1108 which includes a substrate layer 1112 with a strain-sensitive element 1118 formed on a surface of the substrate layer 1112. A pair of reference elements 1120a, 1120b are formed proximate to and on the same surface as the strain-sensitive element 1118. An adhesive layer 1138 is coupled to the substrate layer 1112, and may include a pressure-sensitive adhesive. Reliefs may be formed either partially or entirely through the substrate layer 1112 between the strain-sensitive element 1118 and reference elements 1120a, 1120b. The reliefs may be configured as slits along a primary direction of strain-sensitivity of the strain-sensitive element 1118 (depicted here oriented outwardly from the force-sensing layer 1108). As depicted, the reliefs may have a rectangular cross-section, while in other embodiments the reliefs may have a rounded or other geometric cross-section. The reliefs may act as strain-breaks within the force-sensing layer 1108 to reduce the effect of strain along non-primary directions within a force-sensitive structure. These reliefs are further illustrated above with respect to FIG. 7 and below with respect to FIG. 13.

FIG. 11C illustrates a force-sensing layer 1108 which includes a substrate layer 1112 with a force-sensitive structure formed on the substrate layer 1112. A first adhesive layer 1138 is coupled to the substrate layer 1112, and may include a pressure-sensitive adhesive. The first adhesive layer 1138 is further coupled to a stiffener layer 1140, 1144, which is in turn coupled to a second adhesive layer 1142. The second adhesive layer 1142 may also be a pressure-sensitive adhesive and couple the force-sensing layer 1108 to the display stack.

The stiffener layer includes a first stiffener 1140 and a second stiffener 1144. The first stiffener 1140 is separated from the second stiffener 1144 so as to define an opening in the stiffener layer above the substrate layer 1112, forming a strain concentration region 1146. As a result, tension within the substrate layer 1112 may be greater in the strain concentration region 1146 than elsewhere when a force is applied to the display stack.

A strain-sensitive element 1118 is disposed on the substrate layer 1112 within the strain concentration region 1146. Particularly, in many embodiments, the strain-sensitive element 1118 is disposed at a midpoint between the first stiffener 1140 and the second stiffener 1144. The strain concentration region 1146 may be configured to concentrate strain along a direction corresponding to the primary direction of sensitivity of the strain-sensitive element 1118.

A reference element 1120a is disposed on the substrate layer 1112 below the first stiffener 1140 and another reference element 1120b is disposed on the substrate layer 1112 below the second stiffener 1144. The reference elements 1120a, 1120b may serve as a temperature reference and an electrical response of the reference elements 1120a, 1120b may be measured in tandem with the response of the strain-sensitive element 1118.

Figure 12A:
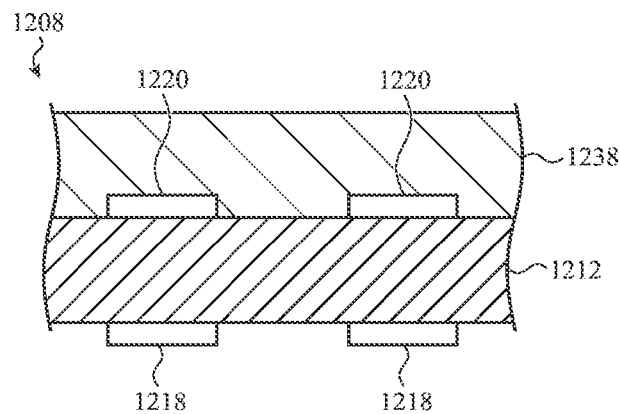
FIGS. 12A-12C depict examples of the force-sensing layer as a stack of further sub-layers.
Figure 12B:
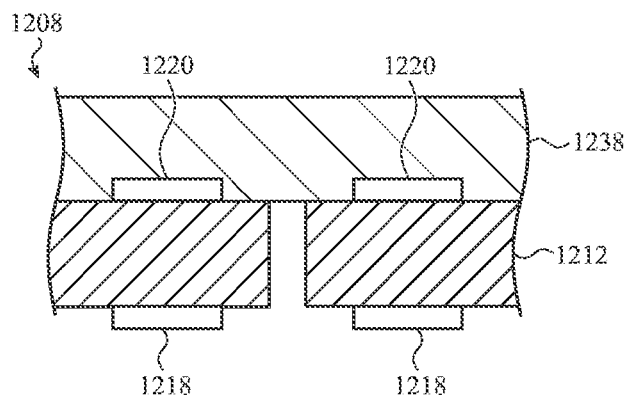
Figure 12C:
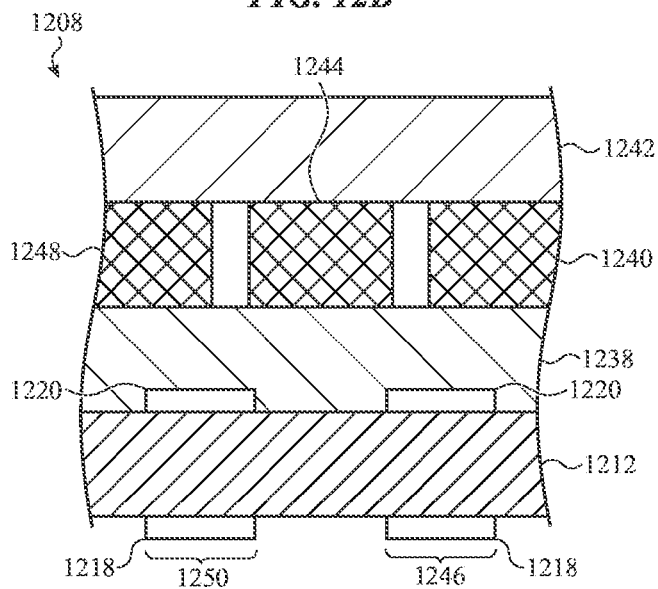

As another example, FIGS. 12A-12C depict a force-sensing layer 1208 according to embodiments similar to the embodiment illustrated in FIG. 4A. As depicted in FIG. 12A, the force-sensing layer 1208 includes a substrate layer 1212 with strain-sensitive elements 1218 formed on a surface of the substrate layer 1212. Reference elements 1220 are formed on opposite surfaces of the substrate layer 1212 and positioned opposite the strain-sensitive elements 1218. An adhesive layer 1238 is coupled to the substrate layer 1212. The adhesive layer 1238 may include a pressure-sensitive adhesive, or another adhesive which couples the substrate layer 1212 to the display stack such that a deflection in the transparent cover is transferred through the display stack and the adhesive layer 1238 to the substrate layer 1212.

FIG. 12B illustrates a force-sensing layer 1208 which includes a substrate layer 1212 with strain-sensitive elements 1218 formed on a surface of the substrate layer 1212. Reference elements 1220 are formed on opposite surfaces of the substrate layer 1212 and positioned opposite the strain-sensitive elements 1218. An adhesive layer 1238 is coupled to the substrate layer 1212, and may include a pressure-sensitive adhesive. Reliefs may be formed either partially or entirely through the substrate layer 1212 between strain-sensitive elements 1218. The reliefs may be configured as slits along a primary direction of strain-sensitivity of the strain-sensitive elements 1218 (depicted here oriented outwardly from the force-sensing layer 1208). The reliefs may act as strain-breaks within the force-sensing layer 1208 to reduce the effect of strain along non-primary directions within a force-sensitive structure. These reliefs are further illustrated above with respect to FIG. 8.

FIG. 12C illustrates a force-sensing layer 1208 which includes a substrate layer 1212 with force-sensitive structures formed on the substrate layer 1212. A first adhesive layer 1238 is coupled to the substrate layer 1212, and may include a pressure-sensitive adhesive. The first adhesive layer 1238 is further coupled to a stiffener layer 1240, 1244, 1248, which is in turn coupled to a second adhesive layer 1242. The second adhesive layer 1242 may also be a pressure-sensitive adhesive and couple the force-sensing layer 1208 to the display stack.

The stiffener layer includes a first stiffener 1240, a second stiffener 1244, and a third stiffener 1248. The second stiffener 1244 is positioned between and separated from the first stiffener 1240 and the third stiffener 1248 so as to define a pair of openings in the stiffener layer above the substrate layer 1212. The openings in the stiffener layer form strain concentration regions 1246, 1250. As a result, tension within the substrate layer 1212 may be greater in the strain concentration regions 1246, 1250 than elsewhere when a force is applied to the display stack.

Strain-sensitive elements 1218 are disposed on the substrate layer 1212 within the strain concentration regions 1246, 1250. Particularly, in many embodiments, the strain-sensitive elements 1218 are disposed at a midpoint between the first stiffener 1240 and the second stiffener 1244, and/or between the second stiffener 1244 and the third stiffener 1248. Reference elements 1220 are disposed on an opposite side of the substrate layer 1212 and also within the strain concentration regions 1246, 1250. The strain concentration regions 1246, 1250 may be configured to concentrate strain along a direction corresponding to the primary direction of sensitivity of the strain-sensitive elements 1218. At the same time, the reference elements 1220 may be sensitive to strain along a direction orthogonal to the primary direction and consequently serve as a temperature reference for the corresponding strain-sensitive elements 1218.

Figure 13:
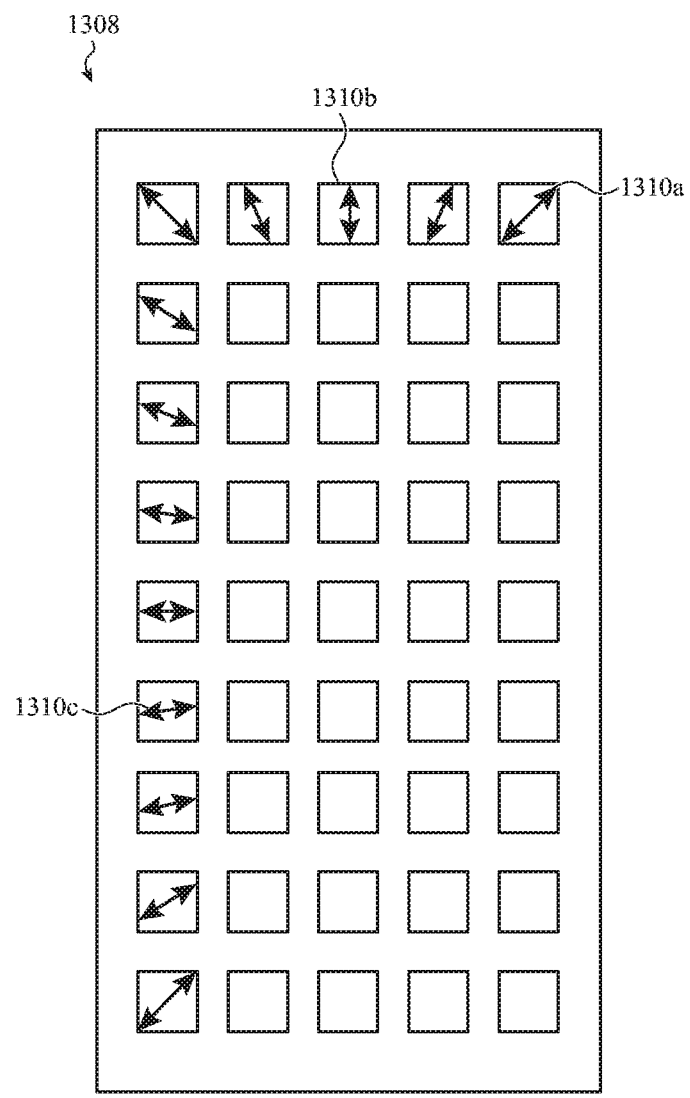
FIG. 13 depicts a top view of a force-sensing layer including an array of force-sensitive structures.

FIG. 13 depicts a top view of a force-sensing layer 1308 including an array of force-sensitive structures, each having a strain-sensitive element with traces that are substantially aligned along a radial path extending between a middle region of the force-sensing layer and a perimeter of the force-sensing layer. The middle region of the force-sensing layer may correspond to a mid-point or center area of a transparent cover sheet positioned above the force-sensing layer.

Each force-sensitive structure 1310a, 1310b, 1310c may be formed according to any of the embodiments depicted above with respect to FIGS. 3-12C. In one example, one force-sensitive structure 1310a may have a strain-sensitive element with traces that are oriented to respond to strain along a 45 degree angle, whereas another force-sensitive structure 1310b may have a strain-sensitive element with traces that are oriented to respond to strain along a 90 degree angle. In another example, a force-sensitive structure 1310c may have a strain-sensitive element with traces that are oriented to respond to strain along an angle between 0 and 45 degrees.

Each of the force-sensitive structures may alternatively or additionally include a strain-sensitive element (e.g., a first strain-sensitive element) configured to exhibit a primary sensitivity to strain along a direction that extends between the perimeter and the middle region (e.g., a radial path). Each force-sensitive structure may further include a reference element (e.g., a second strain-sensitive element) that is either less sensitive to strain along the radial path or that exhibits a primary sensitivity to strain along a direction transverse to the radial path.

In certain embodiments, the orientation of the force-sensitive structures or traces of the strain-sensitive elements may correspond to the position of the force-sensitive structure relative to the enclosure of an electronic device. The orientation of the strain sensitivity may be configured to correspond, for example, with the predicted strain due to the boundary conditions or constraints of the force-sensing layer 1308. For example, a force-sensitive structure positioned proximate to the edge of a screen within or below a display stack may be oriented differently from a force-sensitive structure positioned at or near the center of the display. In some embodiments, as shown in FIG. 13, the orientation of the force-sensitive structures are approximately perpendicular to an edge of the force-sensing layer 1308.

In some embodiments, as shown in FIG. 13, the grid may be formed from an array of force-sensitive structures that includes a subset of edge force-sensitive structures 1310b, 1310c positioned along an edge of the array. In some cases, the edge force-sensitive structures 1310b, 1310c are formed from traces that are oriented along a direction that is substantially perpendicular to the edge. As shown in FIG. 13, the array of force-sensitive structures may include a subset of corner force-sensitive structures 1310a positioned at corners of the array or grid. In some cases, the corner force-sensitive structures 1310a are formed from traces that are oriented along a diagonal direction.

Figure 14:
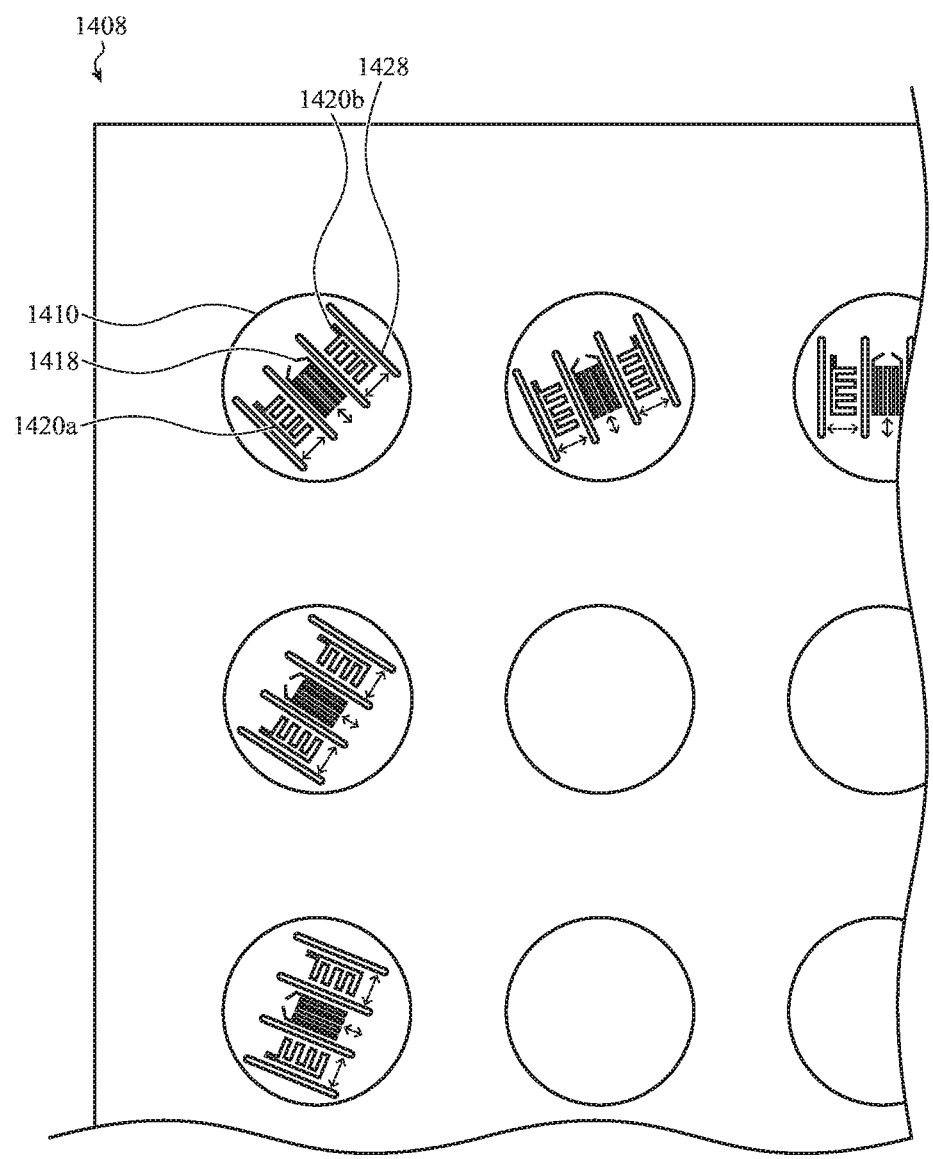
FIG. 14 depicts another force-sensing layer including an array of force-sensitive structures.

Combining the array of force-sensitive structures of FIG. 13 with the relief features of FIG. 7, FIG. 14 illustrates an array of force-sensitive structures having embodiments similar to those depicted in FIGS. 3 and 7. Each force-sensitive structure 1410 within the array may in other embodiments be formed according to any of the embodiments depicted above with respect to FIGS. 3-12C. As depicted in FIG. 14, a force-sensing layer 1408 includes an array of force-sensitive structures 1410, each having a strain-sensitive element 1418 with traces that are substantially aligned along a radial path extending between a perimeter and a middle region of the force-sensing layer or other element of the display stack.

Each of the force-sensitive structures 1410 may alternatively or additionally include a strain-sensitive element (e.g., a first strain-sensitive element) 1418 configured to exhibit a primary sensitivity to strain along a direction that is aligned along a radial path extending from the edge (e.g., perimeter) to a middle region. Each force-sensitive structure may further include a pair of reference elements (e.g., a second strain-sensitive element) 1420a, 1420b positioned proximate to the strain-sensitive element 1418 that are either less sensitive to strain along the radial path or that exhibit a primary sensitivity to strain along a direction transverse to the radial path.

Further features, such as reliefs 1428 in the shape of slits, may be formed within a force-sensitive structure 1410. The performance of the force-sensitive structures may be improved by cutting, etching, or otherwise forming reliefs 1428 in the substrate, between and/or around the force-sensitive element 1418 and reference elements 1420a, 1420b. These reliefs 1428 may isolate and/or amplify the electrical response of a strain-sensitive element 1418 in response to applied strain along a radial path (which may align with a primary direction of strain sensitivity of the strain-sensitive element 1418) while maintaining the reference elements 1420a, 1420b in thermal contact with the strain-sensitive element 1418. The reliefs 1428 may further act as strain-breaks within the force-sensing layer 1408 to reduce the effect of strain along directions other than the radial direction extending between the edge (e.g., perimeter) and the middle region of the force-sensing layer 1408.

Figure 15:
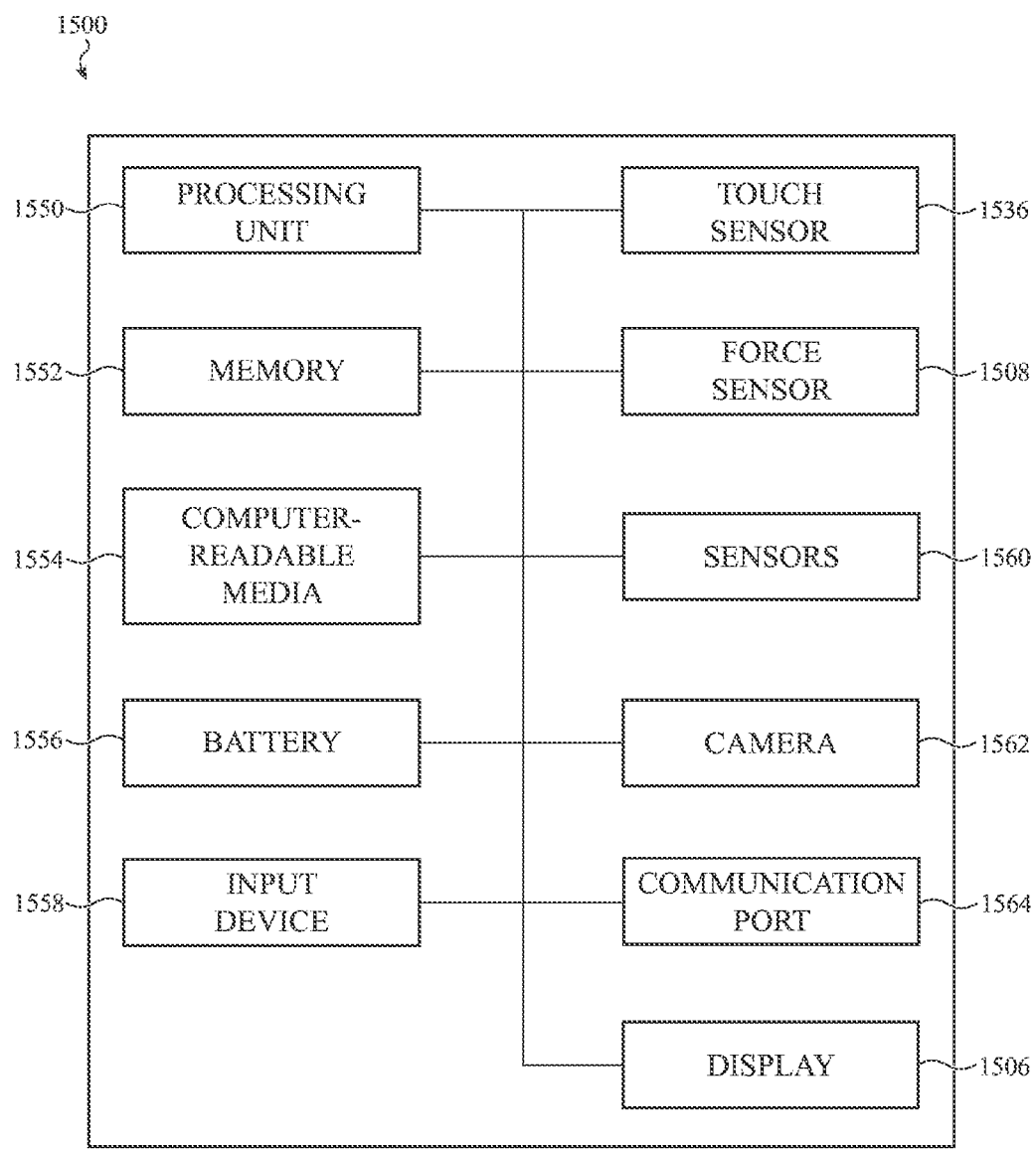
FIG. 15 depicts example components of an electronic device.

FIG. 15 depicts example components of an electronic device in accordance with the embodiments described herein. The schematic representation depicted in FIG. 15 may correspond to components of the devices depicted in FIGS. 1-14, described above. However, FIG. 15 may also more generally represent other types of devices that include a temperature-compensating force sensor in accordance with the embodiments described herein.

As shown in FIG. 15, a device 1500 includes a processing unit 1550 operatively connected to computer memory 1552 and computer-readable media 1554. The processing unit 1550 may be operatively connected to the memory 1552 and computer-readable media 1554 components via an electronic bus or bridge. The processing unit 1550 may include one or more computer processors or microcontrollers that are configured to perform operations in response to computer-readable instructions. The processing unit 1550 may include the central processing unit (CPU) of the device 1500. Additionally or alternatively, the processing unit 1550 may include other processors within the device 1500 including application specific integrated chips (ASIC) and other microcontroller devices. The processing unit 1550 may be configured to perform functionality described in the examples above.

The memory 1552 may include a variety of types of non-transitory computer-readable storage media, including, for example, read access memory (RAM), read-only memory (ROM), erasable programmable memory (e.g., EPROM and EEPROM), or flash memory. The memory 1552 is configured to store computer-readable instructions, sensor values, and other persistent software elements. Computer-readable media 1554 also includes a variety of types of non-transitory computer-readable storage media including, for example, a hard-drive storage device, a solid state storage device, a portable magnetic storage device, or other similar device. The computer-readable media 1554 may also be configured to store computer-readable instructions, sensor values, and other persistent software elements.

In this example, the processing unit 1550 is operable to read computer-readable instructions stored on the memory 1552 and/or computer-readable media 1554. The computer-readable instructions may adapt the processing unit 1550 to perform the operations or functions described above with respect to FIGS. 1-14. The computer-readable instructions may be provided as a computer-program product, software application, or the like.

As shown in FIG. 15, the device 1500 also includes a display 1506. The display 1506 may include a liquid-crystal display (LCD), an organic light emitting diode (OLED) display, an electroluminescent display (ELD), or the like. If the display 1506 is an LCD, the display may also include a backlight component that can be controlled to provide variable levels of display brightness. If the display 1506 is an OLED or ELD type display, the brightness of the display 1506 may be controlled by modifying the electrical signals that are provided to display elements.

The device 1500 may also include a battery 1556 that is configured to provide electrical power to the components of the device 1500. The battery 1556 may include one or more power storage cells that are linked together to provide an internal supply of electrical power. The battery 1556 may be operatively coupled to power management circuitry that is configured to provide appropriate voltage and power levels for individual components or groups of components within the device 1500. The battery 1556, via power management circuitry, may be configured to receive power from an external source, such as an AC power outlet. The battery 1556 may store received power so that the device 1500 may operate without connection to an external power source for an extended period of time, which may range from several hours to several days.

In some embodiments, the device 1500 includes one or more input devices 1558. The input device 1558 is a device that is configured to receive user input. The input device 1558 may include, for example, a push button, a touch-activated button, or the like. In some embodiments, the input device 1558 may provide a dedicated or primary function, including, for example, a power button, volume buttons, home buttons, scroll wheels, and camera buttons. Generally, a touch sensor and a force sensor may also be classified as input devices. However, for purposes of this illustrative example, the touch sensor 1536 and force sensor 1508 are depicted as distinct components within the device 1500.

The device 1500 may also include a touch sensor 1536 that is configured to determine a location of a touch over a touch-sensitive surface of the device 1500. The touch sensor 1536 may include a capacitive array of electrodes or nodes that operate in accordance with a mutual-capacitance or self-capacitance scheme. The touch sensor 1536 may be integrated with an auxiliary display to form a touch-sensitive display similar to the example described above with respect to FIG. 2. The touch sensor 1536 may also be integrated with another component that forms an external surface of the device 1500 to define a touch-sensitive surface.

The device 1500 may also include a force sensor 1508 in accordance with the embodiments described herein. As previously described, the force sensor 1508 may be configured to receive force touch input over a touch-sensitive surface of the device 1500. The force sensor 1508 may include one or more force-sensing layers including force-sensitive structures that are responsive to a force or pressure applied to an external surface of the device. In accordance with the embodiments described herein, the force sensor 1508 may be configured to operate using a dynamic or adjustable force threshold. The dynamic or adjustable force threshold may be implemented using the processing unit 1550 and/or circuitry associated with or dedicated to the operation of the force sensor 1508.

The device 1500 may also include one or more sensors 1560 that may be used to detect an environmental condition, orientation, position, or some other aspect of the device 1500. Example sensors 1560 that may be included in the device 1500 include, without limitation, one or more accelerometers, gyrometers, inclinometers, goniometers, or magnetometers. The sensors 1560 may also include one or more proximity sensors, such as a magnetic hall-effect sensor, inductive sensor, capacitive sensor, continuity sensor, and the like. The proximity sensor(s) may be configured to detect the presence of a support structure or support surface and used to determine a support configuration in accordance with some embodiments.

The sensors 1560 may also be broadly defined to include wireless positioning devices including, without limitation, global positioning system (GPS) circuitry, Wi-Fi circuitry, cellular communication circuitry, and the like. The device 1500 may also include one or more optical sensors including, without limitation, photodetectors, photosensors, image sensors, infrared sensors, and the like. While the camera 1562 is depicted as a separate element in FIG. 15, a broad definition of sensors 1560 may also include the camera 1562 with or without an accompanying light source or flash. The sensors 1560 may also include one or more acoustic elements, such as a microphone used alone or in combination with a speaker element. The sensors may also include a temperature sensor, barometer, pressure sensor, altimeter, moisture sensor or other similar environmental sensor.

The sensors 1560, either alone or in combination, may generally be configured to determine an orientation, position, and/or movement of the device 1500. The sensors 1560 may also be configured to determine one or more environmental conditions, such as a temperature, air pressure, humidity, and so on.

The device 1500 may also include a camera 1562 that is configured to capture a digital image or other optical data. The camera 1562 may include a charge-coupled device, complementary metal oxide (CMOS) device, or other device configured to convert light into electrical signals. The camera 1562 may also include one or more light sources, such as a strobe, flash, or other light-emitting device. The camera 1562 may be generally categorized as a sensor for detecting optical conditions and/or objects in the proximity of the device 1500. However, the camera 1562 may also be used to create photorealistic images that may be stored in an electronic format, such as JPG, GIF, TIFF, PNG, raw image file, or other similar file types.

The device 1500 may also include a communication port 1564 that is configured to transmit and/or receive signals or electrical communication from an external or separate device. The communication port 1564 may be configured to couple to an external device via a cable, adaptor, or other type of electrical connector. In some embodiments, the communication port 1564 may be used to couple the device 1500 to an accessory, such as an external keyboard, a mouse, an external storage drive, or other device configured to send and/or receive electrical signals. The communication port 1564 may be configured to receive identifying information from an external accessory, which may be used to determine a communication configuration.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of the specific embodiments described herein are presented for purposes of illustration and description. They are not intended to be exhaustive or to limit the embodiments to the precise forms disclosed. It will be apparent to one of ordinary skill in the art that many modifications and variations are possible in view of the above teachings.

What is claimed is:

1. An electronic device, comprising:
   an enclosure;
   a display positioned at least partially within the enclosure;
   a transparent cover positioned over the display; and
   an opaque force-sensing layer positioned beneath the display, comprising:
      a substrate;
      an array of force-sensitive structures disposed on the substrate, a force-sensitive structure of the array comprising:
         a strain-sensitive element configured to produce a first electrical response in response to a deflection of the transparent cover;
         a first reference element positioned proximate to the strain-sensitive element and configured to produce a second electrical response in response to the deflection of the transparent cover; and
         a second reference element positioned proximate to the strain-sensitive element and configured to produce a third electrical response in response to the deflection of the transparent cover; and
      a strain concentrating structure comprising a group of stiffener segments, each stiffener segment coupled to the substrate to define a group of strain concentration regions located between pairs of stiffener segments;
   wherein a magnitude of each of the second and third electrical responses is smaller than the first electrical response.

2. The electronic device of claim 1, wherein the electronic device further comprises:
   force-sensing circuitry operatively coupled to the array of force-sensitive structures and configured to estimate a temperature-compensated strain using the first and second electrical responses of the force-sensitive structure.

3. The electronic device of claim 1, wherein:
   the strain-sensitive element is formed from conductive material defining a first set of interconnected traces formed along a first direction;
   the first and second reference elements are formed from the conductive material defining a second and third set of interconnected traces formed along a second direction; and
   the second direction is transverse to the first direction.

4. The electronic device of claim 1, wherein
   the substrate comprises a first substrate layer and a second substrate layer;
   a first strain-relief feature is formed into the first substrate layer between the strain-sensitive element and the first reference element; and
   a second strain-relief feature is formed into the first substrate layer between the strain-sensitive element and the second reference element.

5. The electronic device of claim 4, wherein the first substrate layer comprises one or more of: a polyimide sheet, a glass sheet, or a polyethylene terephthalate sheet.

6. The electronic device of claim 1, wherein:
   the strain-sensitive element is positioned within one of the group of strain-concentration regions;
   the strain-sensitive element is positioned on a first side of the substrate; and
   the strain concentrating structure is positioned on a second side of the substrate opposite the first side.

7. The electronic device of claim 1, wherein the first electrical response is a change in resistance of the strain-sensitive element.

8. The electronic device of claim 1, wherein the strain-sensitive element and the first and second reference elements comprise one or more of: a constantan, a karma, or an isoelastic material.

9. A force-sensing layer for sensing a force applied to an electronic device, the force-sensing layer comprising:
   a substrate;
   an array of force-sensitive structures arranged on the substrate, each force-sensitive structure comprising:
      a strain-sensitive element positioned on the substrate and configured to produce a first change in resistance in response to strain along a direction; and
      a reference element positioned on the substrate proximate to the strain-sensitive element and configured to produce a second change in resistance in response to strain along the direction that is smaller than the first change in resistance; wherein
      the strain-sensitive element and the reference element are disposed in an interlocking spiral pattern.

10. The force-sensing layer of claim 9, wherein the electronic device further comprises:

force-sensing circuitry operatively coupled to the strain-sensitive element and the reference element and configured to estimate a temperature-compensated strain using the first and the second changes in resistance.

11. The force-sensing layer of claim 9, wherein the strain-sensitive element and the reference element are formed on a same surface of the substrate.

12. The force-sensing layer of claim 10, wherein:
the strain-sensitive element comprises a first conductive material disposed in a first spiral pattern;
the reference element comprises a second conductive material disposed in a second spiral pattern interlocked with the first spiral pattern; and
the force-sensing circuitry is configured to compensate for strain based on a known relationship between a material property of the first conductive material and the second conductive material.

13. An electronic device, comprising:
a component forming an exterior surface of the electronic device;
a force-sensing layer positioned below the exterior surface and comprising:
a substrate attached to the component and configured to, in response to a deflection in the exterior surface, produce strain along a series of radial paths extending between a middle region of the substrate and a perimeter of the substrate;
an array of force-sensitive structures disposed on the substrate, each force-sensitive structure comprising:
a first strain-sensitive element configured to exhibit a primary sensitivity to strain along a first direction substantially aligned with a respective radial path; and
a second strain-sensitive element positioned adjacent the first strain-sensitive element and configured to exhibit a primary sensitivity to strain along a second direction that is transverse to the first direction; wherein
the substrate includes a group of strain-relief features formed along the first direction;
the first strain-sensitive element is positioned between a pair of strain-relief features of the group of strain-relief features; and
in response to the deflection in the exterior surface, the first strain-sensitive element exhibits a first change in resistance and the second strain-sensitive element exhibits a second change in resistance that is smaller than the first change in resistance.

14. The electronic device of claim 13, wherein the electronic device further comprises:
force-sensing circuitry operatively coupled to the first and second strain-sensitive elements and configured to estimate a temperature-compensated strain using the first and second changes in resistance.

15. The electronic device of claim 13, wherein the group of strain-relief features includes an array of slits formed into a first side of the substrate.

16. The electronic device of claim 13, wherein:
the first strain-sensitive element is formed on a first surface of the substrate; and
the second strain-sensitive element is formed on a second surface of the substrate opposite the first surface.

17. The electronic device of claim 13, wherein:
the first strain-sensitive element and the second strain-sensitive element are formed on a same surface of the substrate; and
each force-sensitive structure further comprises a third strain-sensitive element positioned on the same surface and adjacent the first strain-sensitive element, and configured to exhibit a primary sensitivity to strain along the second direction.

18. The electronic device of claim 13, wherein:
the electronic device further comprises a display and a transparent cover positioned over the display;
the first strain-sensitive element is positioned between the transparent cover and the display; and
the first and second strain-sensitive elements comprise indium tin oxide.

19. An electronic device, comprising:
a component forming an exterior surface of the electronic device;
a force-sensing layer positioned below the exterior surface and comprising:
a substrate attached to the component and configured to strain in response to a deflection in the exterior surface;
a first force-sensitive structure comprising:
a first strain-sensitive element disposed on a first surface of the substrate and configured to exhibit a first primary sensitivity to the strain along a first direction; and
a second strain-sensitive element disposed on a second surface of the substrate and aligned vertically with the first strain-sensitive element;
a second force-sensitive structure comprising:
a third strain-sensitive element disposed on the first surface of the substrate and configured to exhibit a second primary sensitivity to the strain along a second direction different from the first direction; and
a fourth strain-sensitive element disposed on the second surface of the substrate and aligned vertically with the third strain-sensitive element,
wherein
the substrate includes a group of strain-relief features formed along the first direction;
the first strain-sensitive element is positioned between a pair of strain-relief features of the group of strain-relief features;
the first direction is based on a first location of the first strain-sensitive element on the first surface of the substrate; and
the second direction is based on a second location of the third strain-sensitive element on the first surface of the substrate.

20. The electronic device of claim 19, wherein
the strain comprises a series of radial paths extending outward from a location of a deflection of the substrate;
the first direction and the second direction are substantially transverse to respective radial paths; and
in response to the deflection in the exterior surface:
the first strain-sensitive element exhibits a first change in resistance and the second strain-sensitive element exhibits a second change in resistance that is smaller than the first change in resistance; and
the third strain-sensitive element exhibits a third change in resistance and the fourth strain-sensitive element exhibits a fourth change in resistance that is smaller than the third change in resistance.

* * * * *